(12) United States Patent
Son et al.

(10) Patent No.: US 9,620,494 B2
(45) Date of Patent: Apr. 11, 2017

(54) HYBRID SUBSTRATES, SEMICONDUCTOR PACKAGES INCLUDING THE SAME AND METHODS FOR FABRICATING SEMICONDUCTOR PACKAGES

(71) Applicant: Samsung Electronics Co., Ltd., Suwon-si, Gyeonggi-do (KR)

(72) Inventors: Daewoo Son, Cheonan-si (KR); Chulwoo Kim, Incheon (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 15/260,723

(22) Filed: Sep. 9, 2016

(65) Prior Publication Data

US 2016/0379968 A1     Dec. 29, 2016

Related U.S. Application Data

(60) Continuation of application No. 14/451,982, filed on Aug. 5, 2014, now Pat. No. 9,460,937, which is a
(Continued)

(30) Foreign Application Priority Data

Dec. 15, 2010    (KR) ........................ 10-2010-0128414

(51) Int. Cl.
    *H01L 23/48*        (2006.01)
    *H01L 23/52*        (2006.01)
(Continued)

(52) U.S. Cl.
    CPC ............ *H01L 25/50* (2013.01); *H01L 21/486* (2013.01); *H01L 21/4853* (2013.01);
(Continued)

(58) Field of Classification Search
CPC . H01L 2224/73265; H01L 2224/73204; H01L 2224/32145; H01L 23/49827; H01L 23/481; H01L 23/49822
(Continued)

(56) References Cited

U.S. PATENT DOCUMENTS 5,793,105 A * 8/1998 Pace ................... H01L 21/485
                                                          257/690
6,872,589 B2 * 3/2005 Strandberg ............ H01L 23/13
                                                    257/E23.004
(Continued)

FOREIGN PATENT DOCUMENTS

| JP | 62-122258 A | 6/1987 |
|---|---|---|
| JP | 2006-157065 A | 6/2006 |
| KR | 2009-0047321 A | 5/2009 |

*Primary Examiner* — S. V. Clark
(74) *Attorney, Agent, or Firm* — Harness, Dickey & Pierce, P.L.C.

(57) ABSTRACT

Provided are a hybrid substrate, a semiconductor package including the same, and a method for fabricating the semiconductor package. The hybrid substrate may include an insulation layer, and an organic layer. The insulation layer may include a top, a bottom opposite to the top, and a conductive pattern having different pitches. The organic layer may be connected to the bottom of the insulation layer, and may include a circuit pattern connected to the conductive pattern. The conductive pattern may include a first metal pattern, and a second conductive pattern. The first metal pattern may have a first pitch, and may be disposed in the top of the insulation layer. The second conductive pattern may have a second pitch greater than the first pitch, and may be extended from the first metal pattern to be connected to the circuit pattern through the insulation layer.

20 Claims, 34 Drawing Sheets

Related U.S. Application Data division of application No. 13/197,385, filed on Aug. 3, 2011, now Pat. No. 8,836,149.

(51) Int. Cl.

| | |
|---|---|
| *H01L 29/40* | (2006.01) |
| *H01L 25/00* | (2006.01) |
| *H01L 21/56* | (2006.01) |
| *H01L 25/065* | (2006.01) |
| *H01L 21/768* | (2006.01) |
| *H01L 21/48* | (2006.01) |
| *H01L 23/31* | (2006.01) |
| *H01L 23/498* | (2006.01) |
| *H01L 23/00* | (2006.01) |

(52) U.S. Cl.
CPC .......... *H01L 21/561* (2013.01); *H01L 21/565* (2013.01); *H01L 21/76879* (2013.01); *H01L 23/3128* (2013.01); *H01L 23/49822* (2013.01); *H01L 23/49833* (2013.01); *H01L 23/49838* (2013.01); *H01L 24/03* (2013.01); *H01L 24/09* (2013.01); *H01L 24/73* (2013.01); *H01L 25/0657* (2013.01); *H01L 2224/13025* (2013.01); *H01L 2224/16237* (2013.01); *H01L 2224/16238* (2013.01); *H01L 2224/48091* (2013.01); *H01L 2224/48227* (2013.01); *H01L 2225/0651* (2013.01); *H01L 2225/06517* (2013.01); *H01L 2225/06586* (2013.01); *H01L 2924/15311* (2013.01)

(58) Field of Classification Search
USPC .......................................... 257/784, 786, 701
See application file for complete search history.

(56) References Cited

U.S. PATENT DOCUMENTS

| | | | |
|---|---|---|---|
| 7,495,330 B2 | 2/2009 | Ichikawa | |
| 8,115,312 B2* | 2/2012 | Kawano | H01L 23/481 |
| | | | 257/621 |
| 8,288,875 B2* | 10/2012 | Shimizu | H01L 21/4857 |
| | | | 257/698 |
| 8,988,895 B2 | 3/2015 | Mohammed et al. | |
| 9,076,789 B2 | 7/2015 | Aiba et al. | |
| 9,082,674 B2* | 7/2015 | Zhang | H01L 23/49811 |
| 9,190,401 B2* | 11/2015 | Yim | H01L 24/73 |
| 2005/0253248 A1* | 11/2005 | Shimizu | H01L 21/4857 |
| | | | 257/700 |
| 2007/0045815 A1* | 3/2007 | Urashima | H05K 1/0231 |
| | | | 257/698 |
| 2008/0265399 A1* | 10/2008 | Chao | H01L 23/49816 |
| | | | 257/698 |
| 2010/0038772 A1* | 2/2010 | Taguchi | H01L 21/6835 |
| | | | 257/698 |
| 2011/0063806 A1* | 3/2011 | Kariya | H01L 21/4857 |
| | | | 361/748 |
| 2012/0267751 A1 | 10/2012 | Haba et al. | |
| 2015/0318262 A1 | 11/2015 | Gu et al. | |

\* cited by examiner

HYBRID SUBSTRATES, SEMICONDUCTOR PACKAGES INCLUDING THE SAME AND METHODS FOR FABRICATING SEMICONDUCTOR PACKAGES

CROSS-REFERENCE TO RELATED APPLICATIONS

This is a Continuation Application of U.S. application Ser. No. 14/451,982, filed Aug. 5, 2014, which is a Divisional Application of U.S. application Ser. No. 13/197,385, filed Aug. 3, 2011 (now U.S. Pat. No. 8,836,149), which claims priority under 35 U.S.C. §119 to Korean Patent Application No. 10-2010-0128414, filed on Dec. 15, 2010, in the Korean intellectual Property Office (KIPO), the entire contents of each of which are herein incorporated by reference.

BACKGROUND

1. Field

Example embodiments relate to semiconductors, and more particularly, to hybrid substrates, semiconductor packages having the same, and methods for fabricating the semiconductor packages.

2. Description of the Related Art

As trends continue for miniaturizing electronic products and making them lighter with higher speeds and larger capacities, directions for developing semiconductor packages used in electronic products are changing. For example, as trends for mobile products favor smaller size, thinner dimensions, lighter weight, faster operating speed, and higher reliability, semiconductor packages require configurations adapted for these circumstances. Furthermore, package substrates require more fine pitches due to increased numbers of semiconductor chip pins and chip pads.

SUMMARY

Example embodiments provide a hybrid substrate on which a semiconductor chip with a relatively fine pitch may be mounted, a semiconductor package including the same, and a method for fabricating the semiconductor package.

Example embodiments include a hybrid substrate in which a circuit layer with a fine pitch may be joined to a printed circuit board. Example embodiments may include a hybrid substrate to which a flexible film where a metal pattern having a fine pitch is formed on the printed circuit board is attached.

In accordance with example embodiments, a semiconductor package may include a semiconductor chip and a substrate. In example embodiments the semiconductor chip may include a plurality of chip pads having a first pitch. In example embodiments, the substrate may include a first conductive pattern connected to the chip pads, and a second conductive pattern connected to an external terminal and electrically connected to the first conductive pattern. In example embodiments the first conductive pattern may have the first pitch, and the second conductive pattern may have a second pitch greater than the first pitch.

In accordance with example embodiments, a semiconductor package may include a semiconductor chip, an inorganic layer, and a first organic substrate. In example embodiments, the semiconductor chip may include a plurality of chip pads having a first pitch. In example embodiments, the inorganic layer may have a top surface on which the semiconductor chip is mounted and a bottom surface opposite the top surface. The top surface may include an upper metal pattern having the first pitch connected to the chip pads and the bottom surface may include a lower metal pattern electrically connected to the upper metal pattern. In example embodiments the lower metal pattern may have a second pitch greater than the first pitch. In example embodiments the first organic substrate may be on the bottom surface of the inorganic layer and the first organic substrate may include a first circuit pattern having the second pitch and the first circuit pattern may be connected to the lower metal pattern.

In accordance with example embodiments, a semiconductor package may include a semiconductor chip including a plurality of chip pads having a first pitch, an organic film having a top surface on which the semiconductor chip is mounted and a bottom surface opposite to the top surface, the organic film having a connection pattern electrically connected to the chip pads, and an organic substrate on the bottom surface of the organic film. In example embodiments the organic substrate may have a circuit pattern with a second pitch greater than the first pitch and the circuit pattern may be electrically connected to the connection pattern. In example embodiments, the connection pattern may include a conductive pattern having the first pitch and the conductive pattern may be on the top surface of the organic film and may be connected to the chip pads. The connection pattern may further include a plurality of vias having the second pitch. In example embodiments the plurality of vias may connect the conductive pattern to the circuit pattern and the plurality of vias may penetrate through the organic film.

In accordance with example embodiments, a method for fabricating a semiconductor package may include: providing a substrate, the substrate having a first layer and a second layer on the first layer, the first layer including a conductive pattern with a first pitch and a second pitch greater than the first pitch and the second layer having a circuit pattern with the second pitch, the circuit pattern being connected to the conductive pattern; providing a semiconductor chip on the substrate, the semiconductor chip including a plurality of chip pads having the first pitch; connecting the chip pads to the conductive pattern to electrically connect the semiconductor chip to the substrate; forming a molding layer on the semiconductor chip; and forming an external terminal connected to the circuit pattern.

In accordance with example embodiments, a hybrid substrate may include an insulation layer and an organic layer on a bottom surface of the insulation layer. In example embodiments the insulation layer includes a top surface, the bottom surface opposite to the top surface, and a conductive pattern having different pitches. The organic layer on the bottom surface of the insulation layer may include a circuit pattern connected to the conductive pattern. In example embodiments the conductive pattern may include a first metal pattern having a first pitch on the top surface of the insulation layer, and a second conductive pattern having a second pitch greater than the first pitch connected to the circuit pattern. In example embodiments, the second conductive pattern may extend from the first metal pattern and may penetrate through the insulation layer.

In accordance with example embodiments, a hybrid substrate may include a first insulation layer having a top surface and a bottom surface. The top surface may include a first metal pattern having a first pitch and the bottom surface may include a second metal pattern having a second pitch larger than the first pitch. In example embodiments, the first insulation layer may further include an intermediate pattern extending through the first insulation layer to electrically connect the first metal pattern to the second metal pattern. In example embodiments, the hybrid substrate may further include a second insulation layer on the bottom surface of the first insulation layer. In example embodiments, the second insulation layer may include a circuit pattern electrically connected to the second metal pattern, wherein the second insulation layer is comprised of an organic material.

Example embodiments provide a semiconductor package including: a semiconductor chip including a chip pad with a first pitch; and a substrate including a first conductive pattern connected to the chip pad, and a second conductive pattern which is connected to an external terminal and electrically connected to the first conductive pattern, wherein the first conductive pattern has the first pitch, and the second conductive pattern has a second pitch greater than the first pitch.

In example embodiments, the substrate may include: a first surface on which the semiconductor chip is mounted; and a second surface opposite to the first surface and connected to the external terminal, wherein the first surface may comprise a first pattern with the first pitch disposed on the first surface, and wherein the second pattern may comprise a second pattern with the second pitch disposed on the second surface.

In example embodiments, the substrate may include: an organic substrate including the second conductive pattern; and an inorganic layer disposed on the organic substrate, wherein the inorganic layer may include the first conductive pattern.

In example embodiments, the inorganic layer may include: a top surface on which the semiconductor chip is mounted; and a bottom surface on which the organic substrate is disposed, wherein the first conductive pattern may be disposed on the top surface of the inorganic layer, and wherein a third conductive pattern may be disposed on the bottom surface of the inorganic layer and has the second pitch, the third conductive pattern being connected to the first conductive pattern and in contact with the second conductive pattern.

In example embodiments, the substrate may further include a second organic substrate disposed on the organic substrate, wherein the second organic substrate may be electrically connected to the second conductive pattern, and include a fourth conductive pattern having a third pitch greater than the second pitch.

In example embodiments, the substrate may include: an organic substrate including the second conductive pattern; and an organic layer disposed on the organic substrate, the organic layer comprising the first conductive pattern.

In further embodiments, the organic layer may include a flexible film on which the first conductive pattern is disposed, the flexible film comprising at least one via with the second pitch, the at least one via electrically connecting the first conductive pattern to the second conductive pattern.

In still further embodiments, the flexible film may comprise a polymer film.

In even further embodiments, the organic substrate may include: a top surface on which the flexible film is disposed; and a bottom surface on which the second conductive pattern is disposed, and a metal pattern with the second pitch disposed on the top surface of the organic substrate, wherein the metal pattern is connected to the second conductive pattern and the via, the metal pattern being aligned with the via.

In example embodiments, a semiconductor package may include: a semiconductor chip including a chip pad with a first pitch; an inorganic layer including a top surface on which the semiconductor chip is mounted and a bottom surface opposite to the top surface, wherein an upper metal pattern with the first pitch connected to the chip pad is disposed on the top surface of the inorganic layer, and a lower metal pattern with a second pitch greater than the first pitch connected to the upper metal pattern is disposed on the bottom surface of the inorganic layer; and a first organic substrate disposed on the bottom surface of the inorganic layer, wherein the first organic substrate including a first circuit pattern with the second pitch which is connected to the lower metal pattern.

In example embodiments, the semiconductor package may further include a second organic substrate interposed between the inorganic layer and the first organic substrate, wherein the second organic substrate including a second circuit pattern with a third pitch which connects the lower metal pattern to the first circuit pattern, wherein the third pitch may be greater than the first pitch and be less than the second pitch.

In example embodiments, a semiconductor package may include: a semiconductor chip including a chip pad with a first pitch; an organic film including a top surface on which the semiconductor chip is mounted, a bottom surface opposite to the top surface, and a connection pattern electrically connected to the chip pad; and an organic substrate disposed on the bottom surface of the organic film, the organic film including a circuit pattern with a second pitch greater than the first pitch which is electrically connected to the connection pattern, wherein the connection pattern may include: a conductive pattern with the first pitch which is disposed on the top of the organic film, the conductive pattern being connected to the chip pad; and a via with the second pitch which connects the conductive pattern, the via penetrating through the organic film.

In example embodiments, the organic film may comprise a polymer film which is attached to the organic substrate through an adhesive layer.

In example embodiments, a method for fabricating a semiconductor package may include: providing a substrate comprising a first layer and a second layer disposed on the first layer, the first layer including a conductive pattern with a first pitch and a second pitch greater than the first pitch and the second layer including a circuit pattern with the second pitch which is connected to the conductive pattern; providing a semiconductor chip on the substrate, the semiconductor chip including a chip pad with the first pitch; connecting the chip pad to the conductive pattern to electrically connect the semiconductor chip to the substrate; forming a molding layer molding the semiconductor chip; and forming an external terminal connected to the circuit pattern.

In example embodiments, the providing the substrate may include: providing a support plate; sequentially forming the first and second layers on the support plate; and removing the support plate.

In example embodiments, the forming the first layer may include: forming an inorganic insulation layer which includes a bottom surface facing the support plate and a top surface opposite to the bottom; and forming the conductive layer which includes a first metal pattern with the first pitch which is disposed on the bottom surface of the inorganic insulation layer, a second metal pattern with the second pitch which is disposed on the top surface of the inorganic insulation layer, and an internal metal pattern connecting the first and second metal patterns which are disposed in the inorganic insulation layer.

In example embodiments, the forming the second layer may include forming an organic insulation layer on the top surface of the inorganic insulation layer, wherein the organic insulation layer may include the circuit pattern which is connected to the second metal pattern.

In example embodiments, the providing the substrate may further include forming a third layer on the organic insulation layer, wherein the third layer may include a second organic insulation layer including a second circuit pattern with a third pitch greater than the second pitch.

In example embodiments, the providing the semiconductor chip may include: forming a flexible film including the conductive pattern to provide the first layer; forming an organic substrate including the circuit pattern to provide the second layer; and connecting flexible film to the organic substrate through an adhesive layer.

In further embodiments, the forming the flexible film may include: providing a polymer film which includes a top surface and a bottom surface; and forming the conductive pattern which includes a metal pattern with the first pitch which is disposed on the top surface of the polymer film, and a via with the second pitch which is connected to the metal pattern, wherein the via penetrates through the polymer film.

In still further embodiments, the forming the conductive pattern may include: forming the metal pattern on the top surface of the polymer film; forming a via hole which penetrates through the metal pattern and the polymer film; and forming the via connected to the metal pattern in the via hole.

In even further embodiments, the forming the conductive pattern may include: attaching the polymer film to the organic substrate through an adhesive layer; forming a via hole penetrating through the polymer film; forming the metal pattern on the top surface of the polymer film; and forming the via connected to the metal pattern in the via hole.

In example embodiments, a hybrid substrate may include: an insulation layer including a top surface, a bottom surface opposite to the top surface, and a conductive pattern having different pitches; and an organic layer disposed on the bottom surface of the insulation layer, the organic layer including a circuit pattern connected to the conductive pattern, wherein the conductive pattern may include: a first metal pattern having a first pitch disposed on the top surface of the insulation layer; and a second conductive pattern having a second pitch greater than the first pitch connected to the circuit pattern, the second conductive pattern extending from the first metal pattern and penetrating through the insulation layer.

In example embodiments, the insulation layer may comprise one of an organic layer and an inorganic layer.

BRIEF DESCRIPTION OF THE DRAWINGS

The accompanying drawings are included to provide a further understanding of example embodiments, and are incorporated in and constitute a part of this specification. The drawings illustrate example embodiments and, together with the description, serve to explain principles of the inventive concepts. In the drawings.

DETAILED DESCRIPTION OF EXAMPLE EMBODIMENTS

Figure 1:
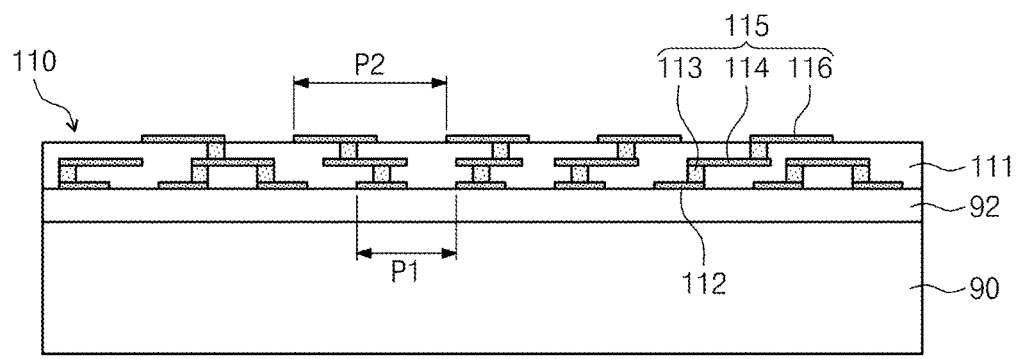
FIGS. 1 to 4 are sectional views illustrating a method for fabricating a semiconductor package according to example embodiments.

Example embodiments will be described more fully hereinafter with reference to the accompanying drawings, in which example embodiments are shown. The present invention may, however, be embodied in many different forms and should not be construed as limited to example embodiments as set forth herein. Rather, example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers that may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing example embodiments only and is not intended to be lining of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be described in detail with reference to the accompanying drawings. Advantages of the inventive concepts in comparison with the related art will be clarified through the detailed description of example embodiments and the claims with reference to the accompanying drawings. In particular, example embodiments are well pointed out and aspects of the invention are clearly claimed in the claims. The inventive concepts, however, may be best appreciated by referring to the following detailed description of example embodiments with reference to the accompanying drawings. In the drawings, like reference numerals refer to like elements throughout.

<First Embodiment>

FIGS. 1 to 4 are sectional views illustrating a method for fabricating a semiconductor package according to example embodiments.

Referring to FIG. 1, a first circuit layer 110 may be formed on a support plate 90. A separation layer 92 may be further formed between the support plate 90 and the first circuit layer 110. The support plate 90 may be formed of silicon or glass. The first circuit layer 110 may include an insulation layer 111 in which a circuit pattern 115 is formed. The separation layer 92 may be formed of a silicon-based or epoxy-based adhesive material. The separation layer 92 may provide coupling strength between the first circuit layer 110 and the support plate 90, and may prevent or reduce damage of the first circuit layer 110 when the support plate 90 is separated as described below in FIG. 6.

The circuit pattern 115 may include a first metal pattern 112 that is relatively fine and a second metal pattern 116 that is relatively coarse. For example, the first metal pattern 112 may have a first pitch P1, and the second metal pattern 116 may have a second pitch P2 greater than the first pitch P1. The first pitch P1 may be equal to or less than about 10 μm, and the second pitch P2 may be equal to or greater than about 10 μm, for example greater than about 20 μm. The insulation layer 111 may he formed by depositing an inorganic material, for example, a silicon-oxide ($SiO_2$) layer, a silicon nitride (SiN) layer, or any combination thereof. For example, the insulation layer 111 may be formed to less than about 10 μm. A via 113 that connects the first metal pattern 112 and the second metal pattern 116 may be provided therebetween, or the via 113 and an internal pattern 114 may be provided between the first and second metal patterns 112 and 116. The first circuit layer 110 may be formed using a FAB process that forms semiconductor chips. The circuit pattern 115 according to example embodiments may include the three layers of metal patterns 112, 114, and 116 and the two layers of via 113, but example embodiments are not limited thereto. The number of layers of the metal patterns 112, 114, and 116 and/or the via 113 may be two or more.

Figure 2:
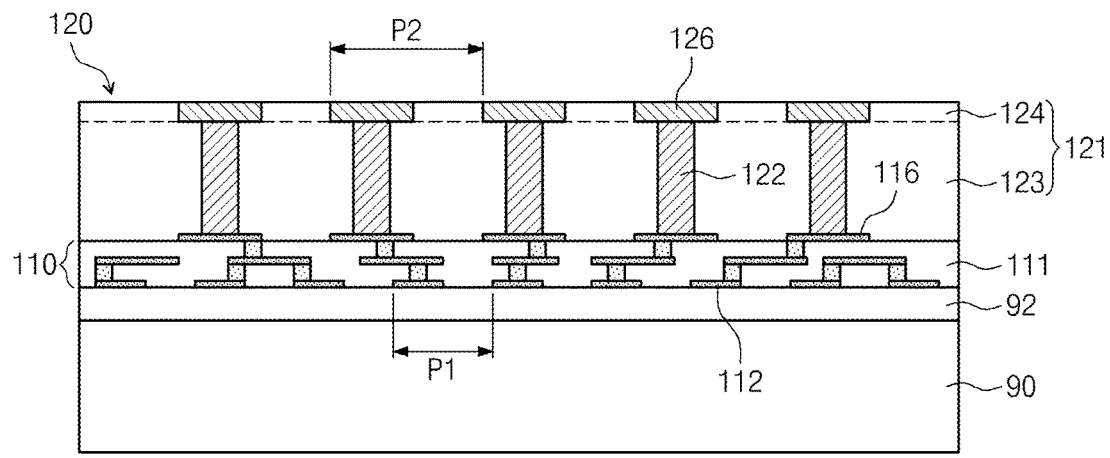

Referring FIG. 2, a second circuit layer 120 may be formed on the first circuit layer 110. According to example embodiments, the second circuit layer 120 that has been previously formed is not joined to the first circuit layer 110, but the first circuit layer 110 may be formed and then the second circuit layer 120 may be formed subsequently. The second circuit layer 120 may include a package substrate 121 that is mainly formed of an organic material, a via 122 that is connected to the second metal pattern 116 penetrating through the package substrate 121, and a substrate pad 126 that is connected to the via 122. According to example embodiments, the second circuit layer 120 may be formed on the first circuit layer 110, using a PCB process of fabricating a printed circuit board (PCB). For example, a core 123 may be formed on the first circuit layer 110, and the via 122 connected to the second metal pattern 116 through the core 123 may be formed. Subsequently, the substrate pad 126 may be formed on the core 123 to be connected to the via 122, and an insulation layer 124 may be formed to cover the core 123. The core 123 may be formed of an insulating material such as reinforced fiberglass or epoxy resin, and the insulation layer 124 may be formed of Prepreg. The via 122 and the substrate pad 126 may be formed of metal, for example, copper or aluminum. The via 122 and/or the substrate pad 126 may be aligned with the second metal pattern 116. Accordingly, the via 122 and/or the substrate pad 126 may have the second pitch P2 of about 20 μm or more identically or similarly to the second metal pattern 116.

Figure 3:
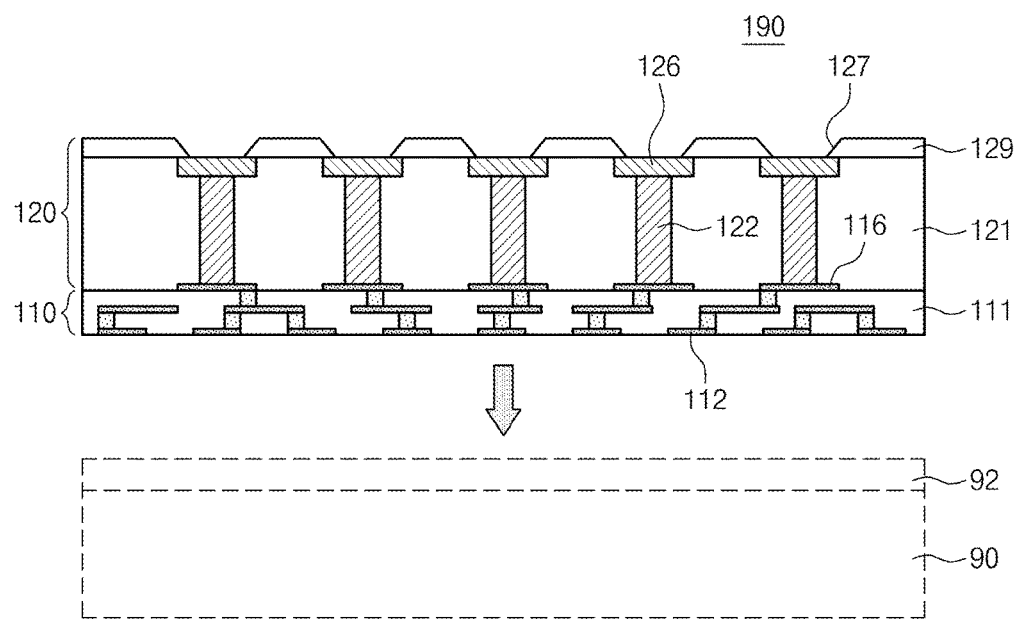
Figure 4:
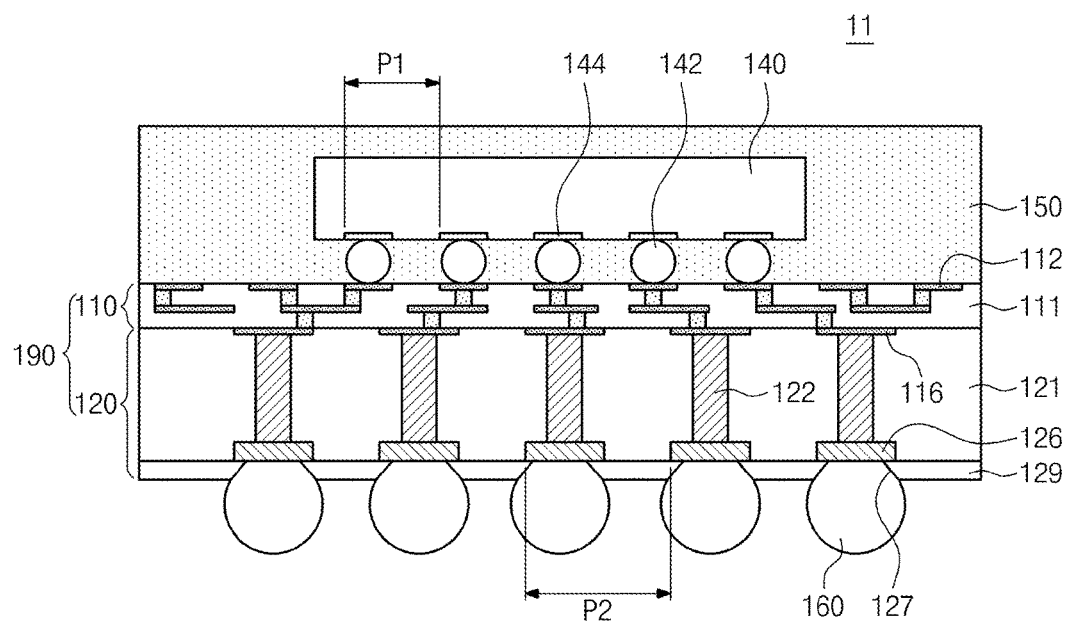

Referring to FIG. 3, a solder mask layer 129 may be further formed on the package substrate 121 in order to limit a position of a solder ball (see 160 of FIG. 4). For example, the solder mask layer 129 may be formed on the package substrate 121 by coating solder resist and then patterning through a photo process to have an opening 127 to open the substrate pad 126. The second circuit layer 120, including the package substrate 121 or the package substrate 121 and the solder mask layer 129, may have a thickness of about 100 μm to about 500 μm.

The support plate 90 may be separated from the first circuit layer 110 before or after formation of the solder mask layer 129. For example, the solder mask layer 129 may be formed, and thereafter the support plate 90 may be separated from the first circuit layer 110. The separation layer 92 may be also separated together with the support plate 90. As another example, the separation layer 92 may be removed using etchant or plasma after the support plate 90 is separated.

Referring to FIG. 4, a semiconductor package 11 may be formed by mounting a semiconductor chip 140 on the first circuit layer 110. For example, a hybrid substrate 190 may be flipped such that the first circuit layer 110 faces upward, and the semiconductor chip 140 may be mounted on the first circuit layer 110. A solder ball 160 as an external terminal may be attached to the substrate pad 126 of the second circuit layer 120. The solder ball 160, for example, may have the second pitch P2. Additionally, the semiconductor package 11 may be molded by a molding layer 150.

The semiconductor chip 140 may be a memory chip, a logic chip or the combination thereof, which includes a chip pad 144 having a relatively fine pitch (for example, the first pitch P1). The semiconductor chip 140 may be flip-chip bonded on the hybrid substrate 190. For example, the semiconductor chip 140 may be mounted on the first circuit layer 110 in the face-down scheme and connected to the first metal pattern 112 through the solder ball 142, and thus may be electrically connected to the hybrid substrate 190.

The hybrid substrate 190 may include the first metal pattern 112 with the first pitch P1 and the substrate pad 126 with the second pitch P2 greater than the first pitch P1. Accordingly, the semiconductor chip 140 having the chip pad 144 with the first pitch P1 may be easily mounted on the hybrid substrate 190. The hybrid substrate 190 may include the first circuit layer 110 including the first metal pattern 112 having the fine first pitch P1 that is mainly formed of an inorganic material, and the second circuit layer 120 that includes the substrate pad 126 having the second pitch P2 greater than the first pitch P1 and is mainly formed of an organic material. Since the first circuit layer 110 is mainly formed of an inorganic material, the fine pattern can be easily formed in the first circuit layer 110 compared to the second circuit layer 120 that is mainly formed of an organic material. Accordingly, semiconductor chip 140 in which the chip pad 144 is finely arranged may be easily mounted on the hybrid substrate 190 without assistance of an interposer. Moreover, the hybrid substrate 190 may electrically connect electronic devices having different pitches. For example, the semiconductor chip 140 with the fine pitch P1 may be electrically connected to a module substrate or semiconductor package with the coarse pitch P2 with ease by means of the hybrid substrate 190.

The semiconductor package 11 may be a wafer level package or chip level package. If the semiconductor package 11 is a wafer level package, the semiconductor package 11 may be divided into a plurality of chip level semiconductor packages in a sawing process.

<Second Embodiment>

Figure 5:
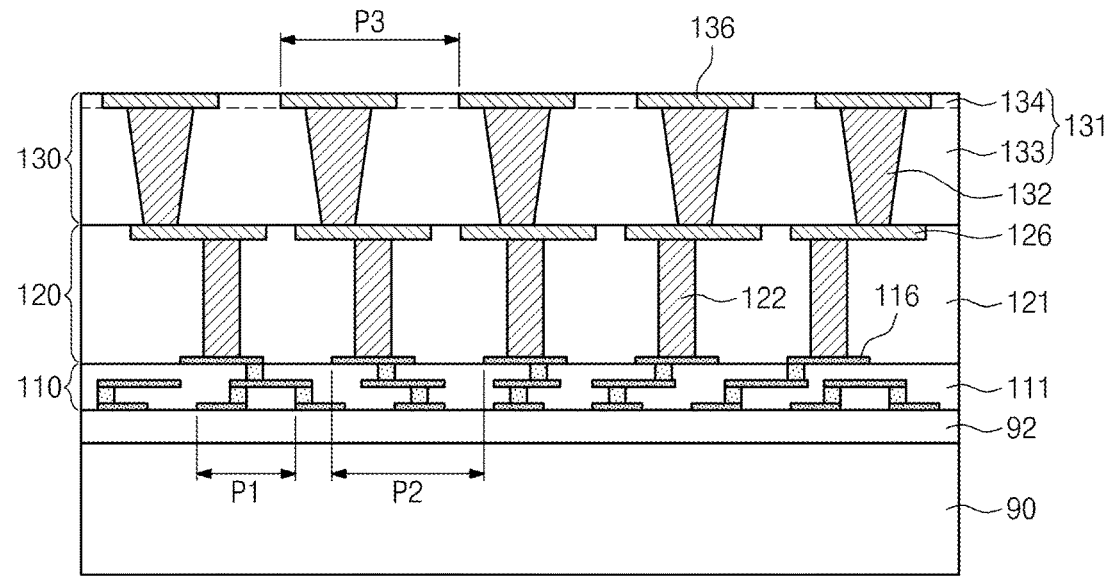
FIGS. 5 to 7 are sectional views illustrating a method for fabricating a semiconductor package according to example embodiments.
Figure 6:
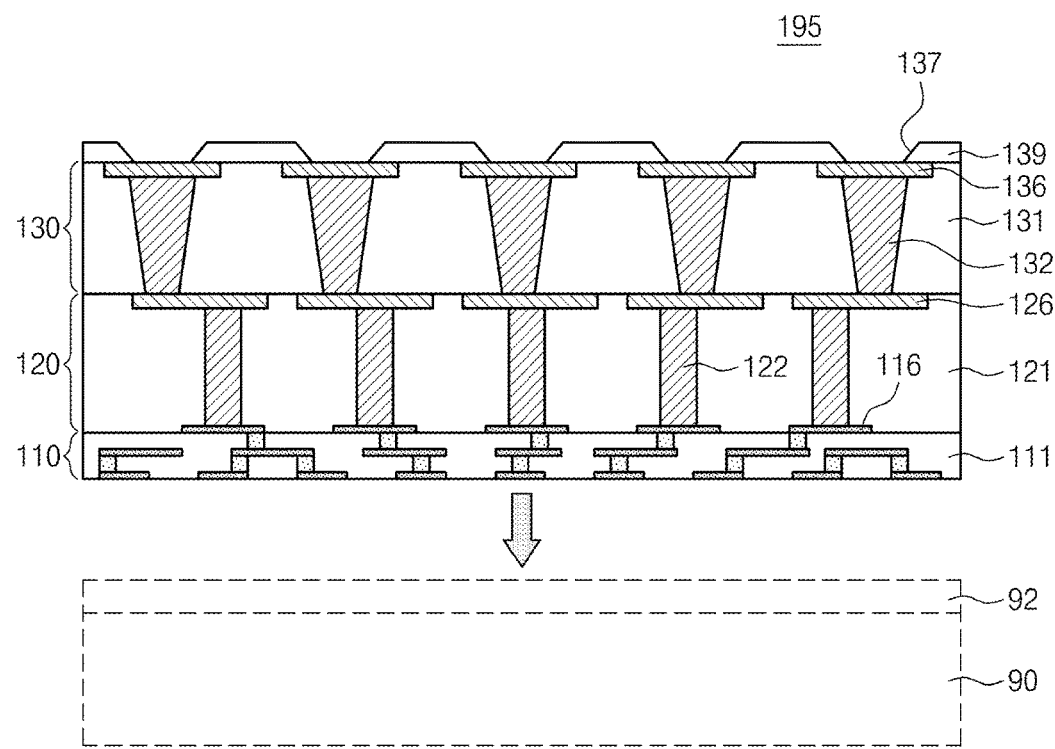
Figure 7:
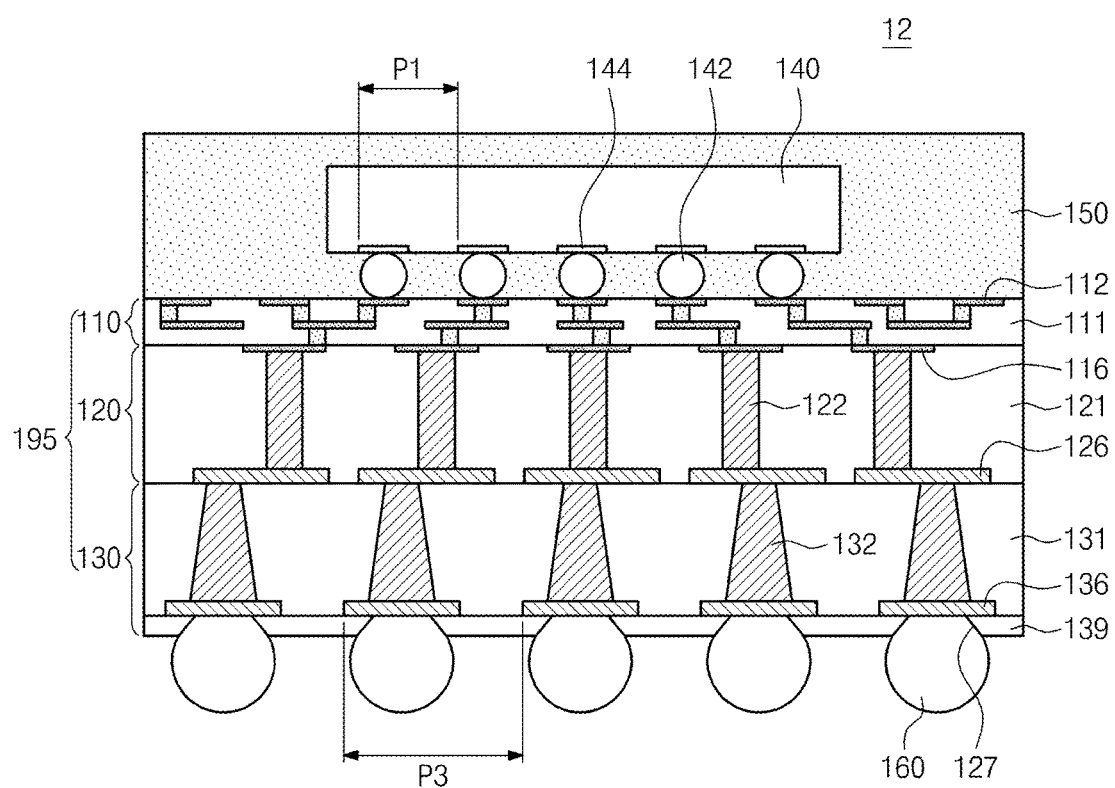

FIGS. 5 to 7 are sectional views illustrating a method for fabricating a semiconductor package according to example embodiments.

Referring to FIG. 5, the first circuit layer 110 may be formed on the support plate 90, the separation layer 92 may be disposed therebetween, and the second circuit layer 120 may be formed on the first circuit layer 110, in a process identical or similar to the process that has been described above with reference to FIGS. 1 and 2. The first circuit layer 110 may include the insulation layer 111 in which the first metal pattern 112 having the first pitch P1 and the second metal pattern 116 having the second pitch P2 are formed. The second circuit layer 120 may include the package substrate 121 in which the substrate pad 126 and the via 122 having the second pitch P2 are formed.

A third circuit layer 130 may be further formed on the second circuit layer 120. The third circuit layer 130 may be provided in order to implement a third pitch P3 greater than the second pitch P2 of the second circuit layer 120. The third circuit layer 130 may include a second package substrate 131 that is mainly formed of an organic material, a second via 132 that is connected to the substrate pad 126 through the second package substrate 131, and a second substrate pad 136 that is connected to the second via 132. The second via 132 and the second substrate pad 136 may have the third pitch P3 greater than the second pitch P2. For example, the substrate pad 126 may be formed greater than that of FIG. 2, and thus the second substrate pad 136 and/or the second via 132 having the third pitch P3 greater than the second pitch P2 may be formed. The third circuit layer 130 may be formed in a PCB process identically or similarly to the process of forming the second circuit layer 120. For example, a second core 133 formed of reinforced fiberglass or epoxy resin may be formed on the second circuit layer 120, and the second via 132 connected to the substrate pad 126 through the second core 133 may be formed. Subsequently, the second substrate pad 136 that is formed of metal connected to the second via 132 and a second insulation layer 134 that is formed of Prepreg covering the second core 133 may be formed on the second core 133.

Referring to FIG. 6, a solder mask layer 139, having an opening 137 that allows the second substrate pad 136 to be opened on the second package substrate 131, may be formed by coating and patterning solder resist. After formation of the solder mask layer 139, the support plate 90 may be separated from the first circuit layer 110, and the hybrid substrate 195, including the first circuit layer 110 that is mainly formed of an inorganic material and the second and third circuit layers 120 and 130 that are mainly formed of an organic material, may be formed.

Referring to FIG. 7, the semiconductor chip 140 may be mounted on the first circuit layer 110, and the semiconductor package 12 may be formed by optionally forming the molding layer 150. The solder ball 160 may be attached to the second substrate pad 136 of the third circuit layer 130. The solder ball 160 may have the third pitch P3. According to example embodiments, the semiconductor chip 140 having the chip pad 144 with the first pitch P1 may be mounted on the hybrid substrate 195 and electrically connected to an electric device with the third pitch P3, for example a module substrate or semiconductor package.

<Third Embodiment>

FIGS. 8A, 9A, 10A and 11A are sectional views illustrating a method for fabricating a semiconductor package according to example embodiments. FIGS. 8B, 9B, 10B and 11B are plan views of FIGS. 8A, 9A, 10A and 11A, respectively. FIGS. 8A, 9A, 10A and 11A are sectional views taken along lines I-I' of FIGS. 8B, 9B, 10B and 11B, respectively.

Figure 8A:
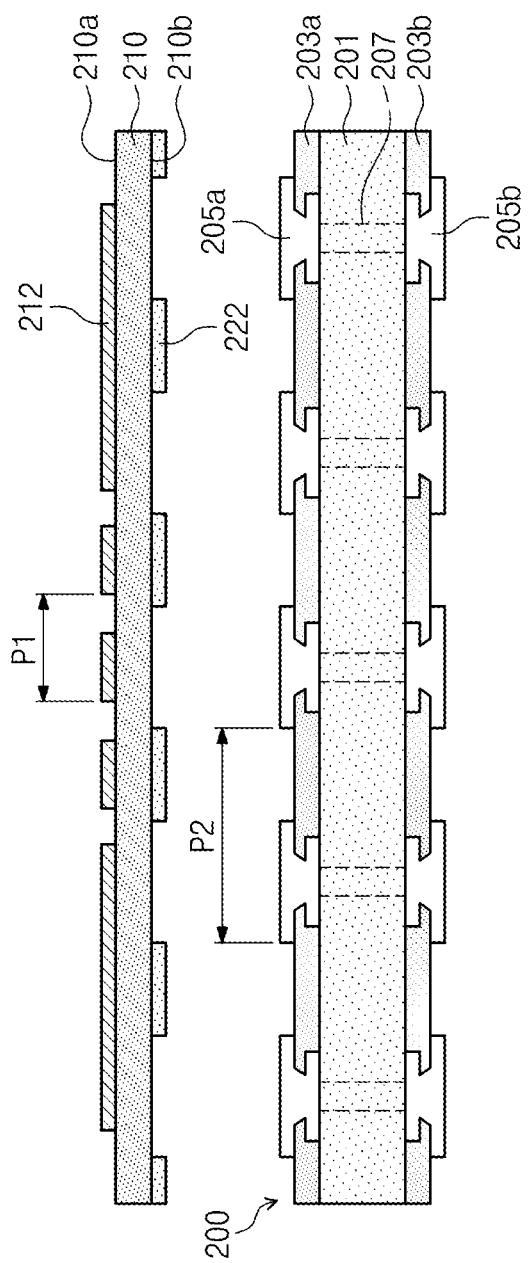
FIGS. 8A, 9A, 10A and 11A illustrate a method for fabricating a semiconductor package according to example embodiments, and are sectional views taken along lines I-I' of FIGS. 8B, 9B, 10B and 11B, respectively.
Figure 8B:
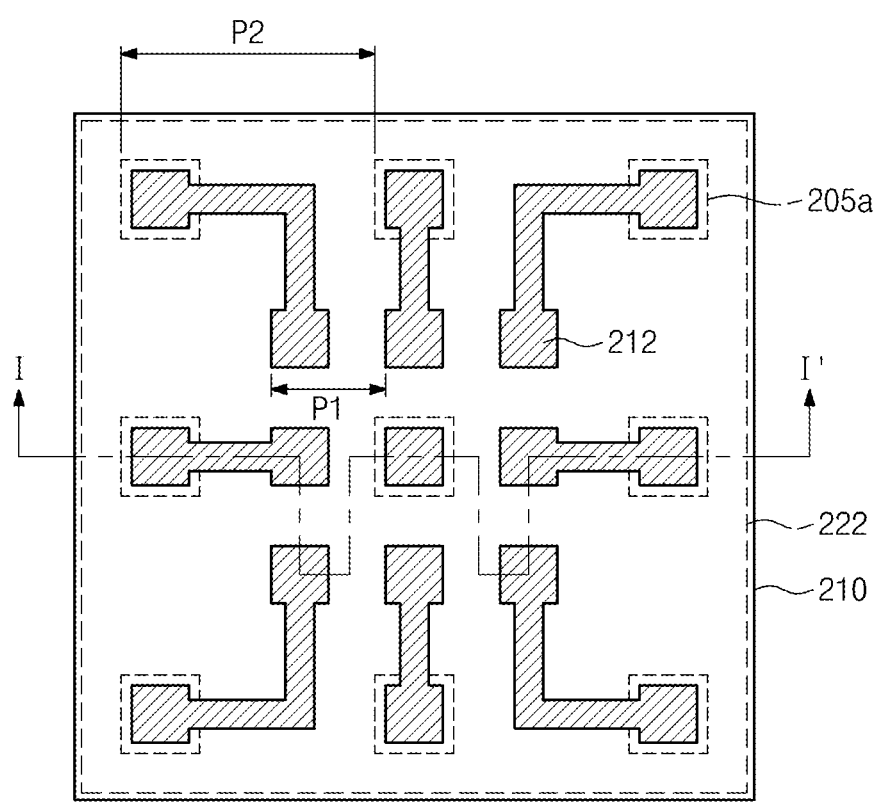
FIGS. 8B, 9B, 10B and 11B are plan views of FIGS. 8A, 9A, 10A and 11A, respectively.

Referring to FIGS. 8A and 8B, a film 210 and a printed circuit board 200 may be provided. The film 210 may include a metal layer 212 with the first pitch P1, and the printed circuit board 200 may include an upper metal pattern 205a with the second pitch P2 greater than the first pitch P1.

The film 210 may be a flexible film that is formed of an organic material, for example, a polymer such as a polyimide, to be easily bendable. The film 210 may have about 20 µm or less in thickness. The metal layer 212 may be formed on a top surface 210a of the film 210. The metal layer 212 may be formed by plating or screen printing of metal, for example, copper or aluminum. As illustrated in FIG. 8B, the metal layer 212 may partially overlap with the upper metal pattern 205a of the printed circuit board 200 and have a linear and/or curved shape.

Figure 20:
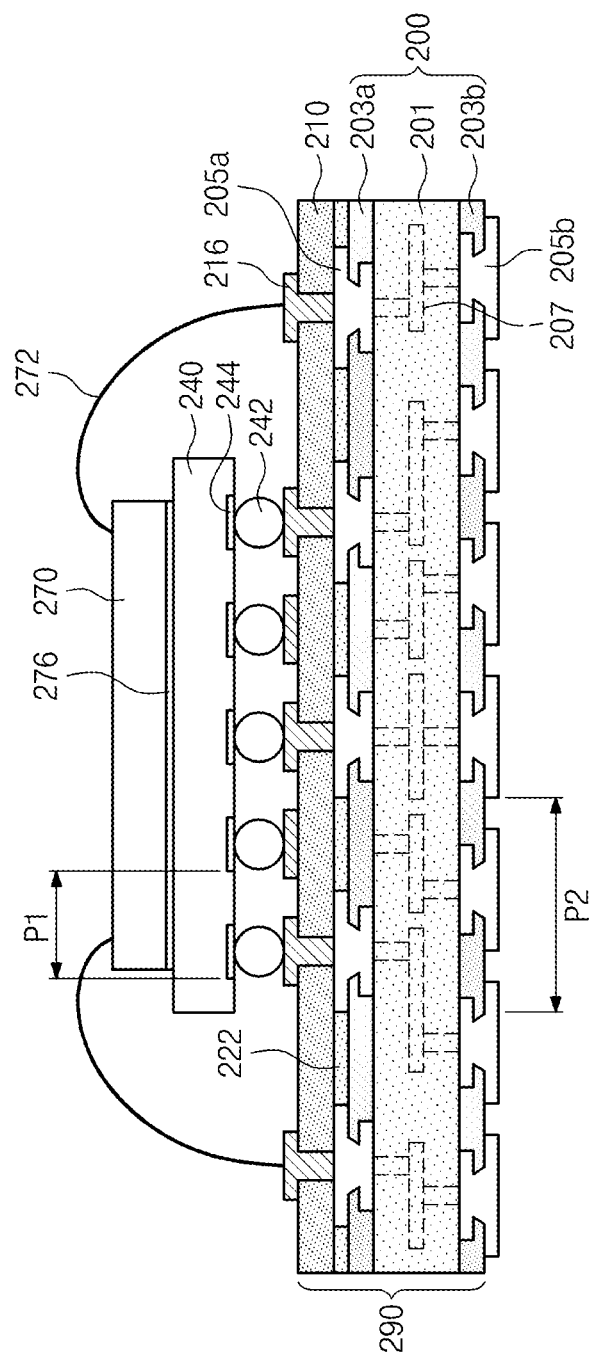
FIGS. 20 and 21 are sectional views illustrating a method for fabricating a semiconductor package according to example embodiments.

The printed circuit board 200 may be mainly formed of an organic material. For example, the printed circuit board 200 may include a core 201 that is formed of reinforced fiberglass or epoxy resin, upper and lower insulation layers 203a and 203b that are formed of Prepreg that coat both surfaces of the core 201, and upper and lower metal patterns 205a and 205b that are formed of metals disposed at the both surfaces of the core 201. The upper metal pattern 205a and the lower metal pattern 205b may be connected through an internal metal pattern 207 that is formed in the core 201. The internal metal pattern 207 may have a via shape as illustrated in FIG. 8 or a structure in which a via and a metal layer are connected as illustrated in FIG. 20. The lower metal pattern 205b may have the second pitch P2 like the upper metal pattern 205a.

An adhesive layer 222 may be provided on a bottom surface 210b of the film 210. The adhesive layer 222, for example, may be formed of a resin-based material, and thus provided to attach the film 210 to the printed circuit board 200. The adhesive layer 222 may be patterned to accommodate the upper metal pattern 205a of the printed circuit board 200.

Figure 9A:
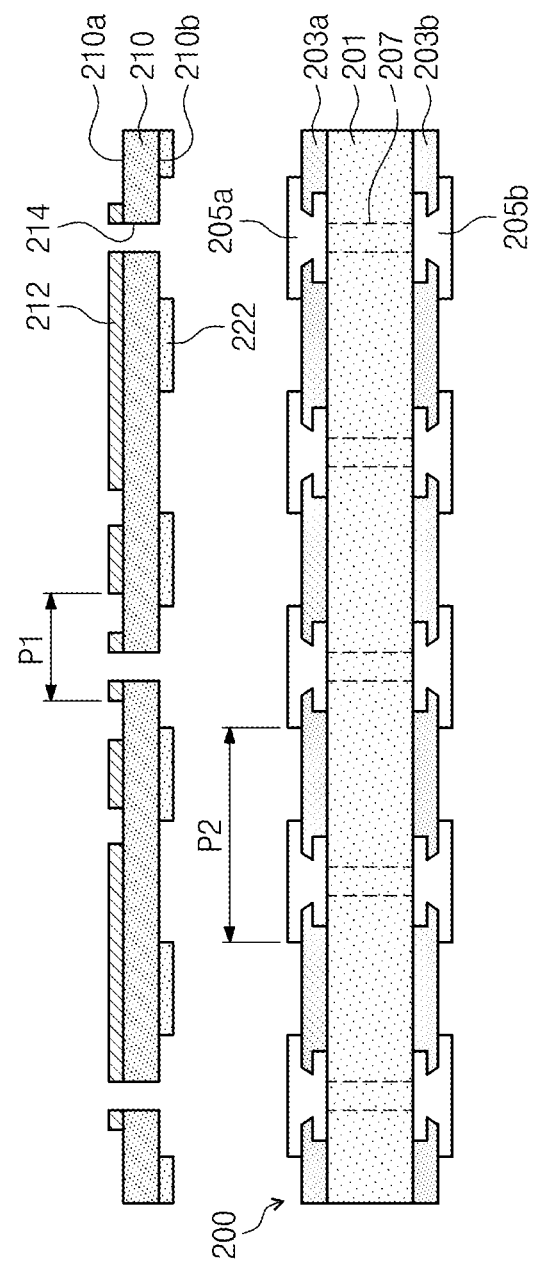
Figure 9B:
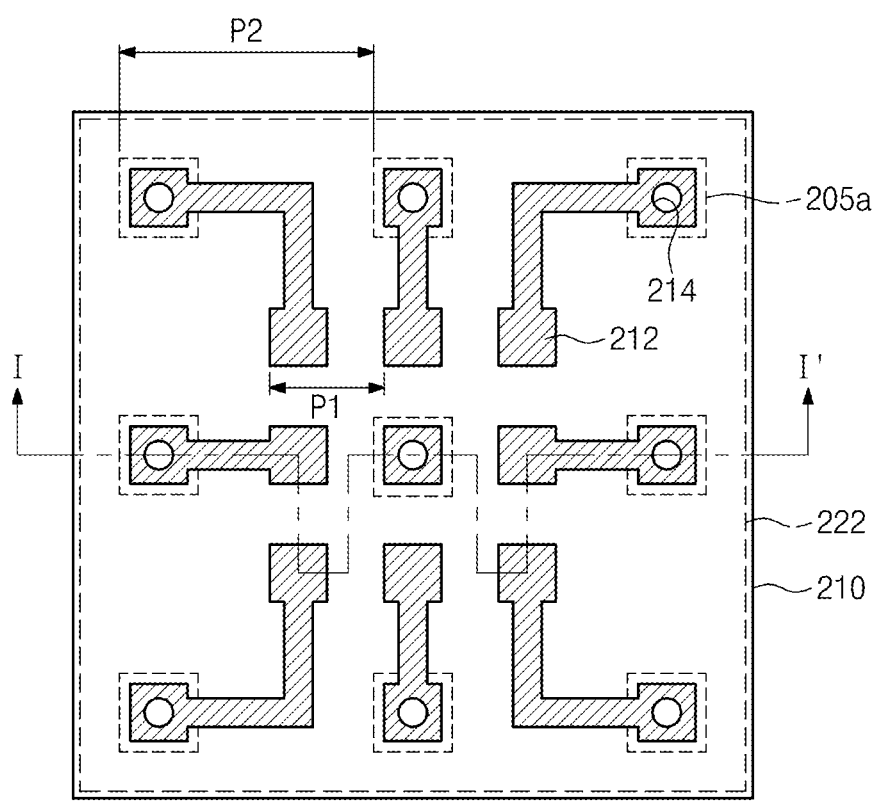

Referring to FIGS. 9A and 9B, a via hole 214 may be formed through the film 210. The via hole 214 may provide an area to be occupied by a via 213 of FIG. 10A that connects the metal layer 212 to the upper metal pattern 205a of the printed circuit board 200. The via hole 214 may be aligned with the upper metal pattern 205a, and thus may have the second pitch P2. The via hole 214 may be formed by partially removing the metal layer 212 and the film 210, in a drilling process using a punching device or laser. According to example embodiments, a process of forming the via hole 24 may use a laser drilling process for forming the via hole 214 more accurately and finely.

Figure 10A:
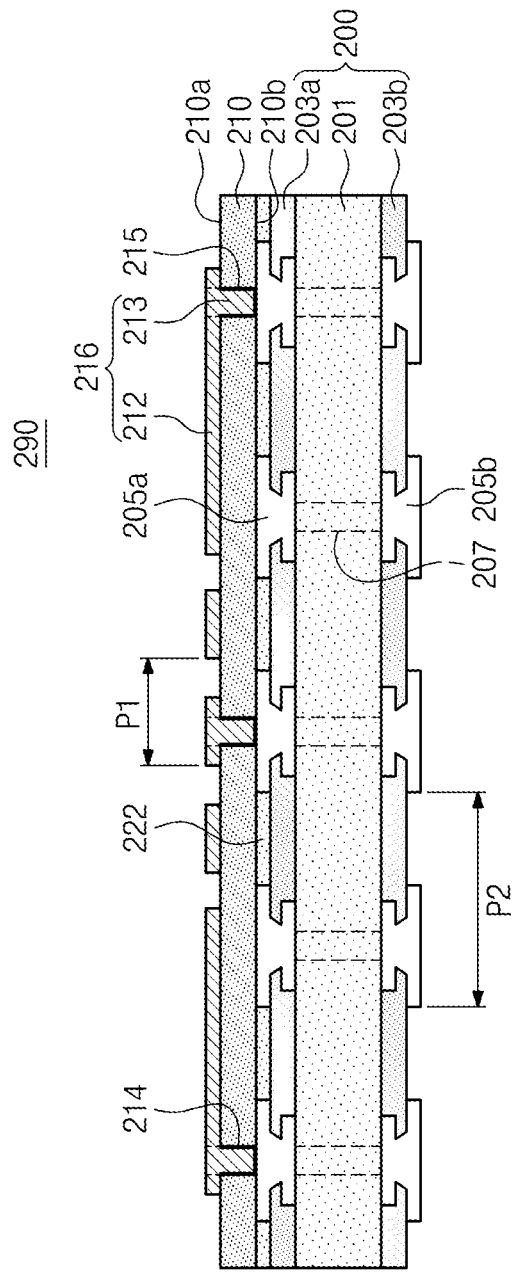
Figure 10B:
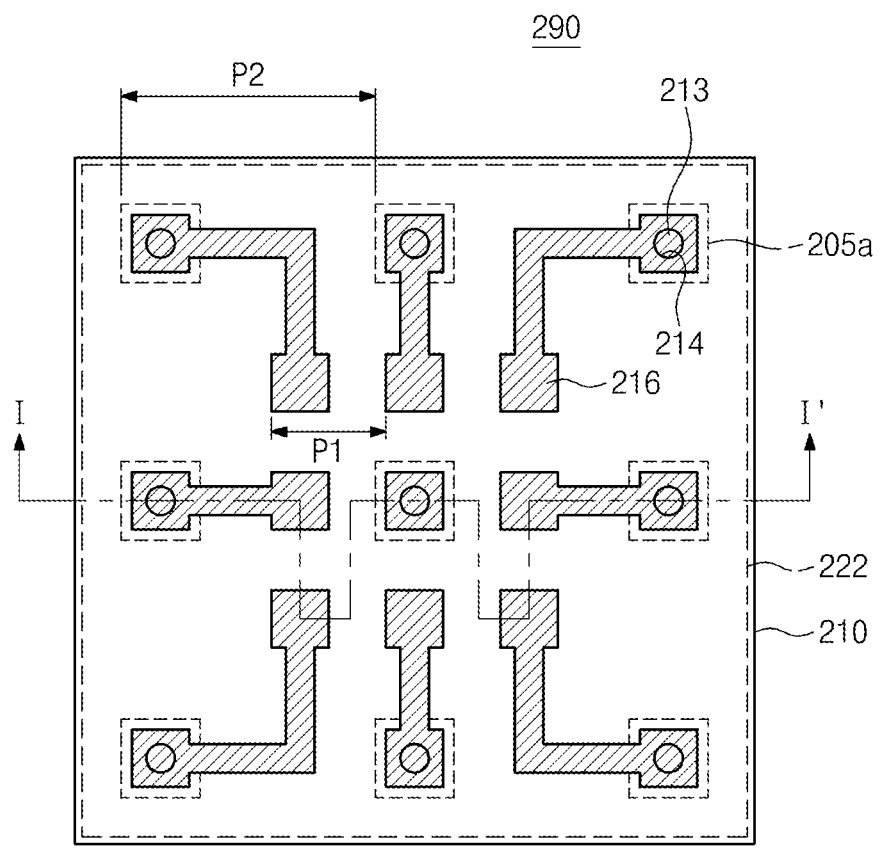

Referring to FIGS. 10A and 10B, a via 213 may be formed by filling the via hole 214 with metal, for example, copper or aluminum. The via 213 may have the second pitch P2. The film 210 may be attached to the printed circuit board 200 before or after formation of the via 213. The film 210 may be attached to the printed circuit board 200, and thereafter, the upper metal pattern 205a exposed through the via hole 214 may be used as a seed, or a seed layer 215 may be formed in the via hole 214 and then the via 213 may be formed in a plating process. According to the plating process, coupling strength between the via 213 and the upper metal pattern 205a may increase, and the contact resistance may decrease. The metal layer 212 may be connected to the upper metal pattern 205a through the via 213. The metal layer 212 and the via 213 may constitute a connection pattern 216. According to example embodiments, the hybrid substrate 290 to which the film 210 having the connection pattern 216 connected to the upper metal pattern 205a is attached may be formed on the printed circuit board 200 having the upper metal pattern 205a and/or lower metal pattern 205b having the second pitch P2. The connection pattern 216 may have the first pitch P1 on the top surface 210a of the film 210 and the second pitch P2 on the bottom surface 210b of the film 210.

Figure 11A:
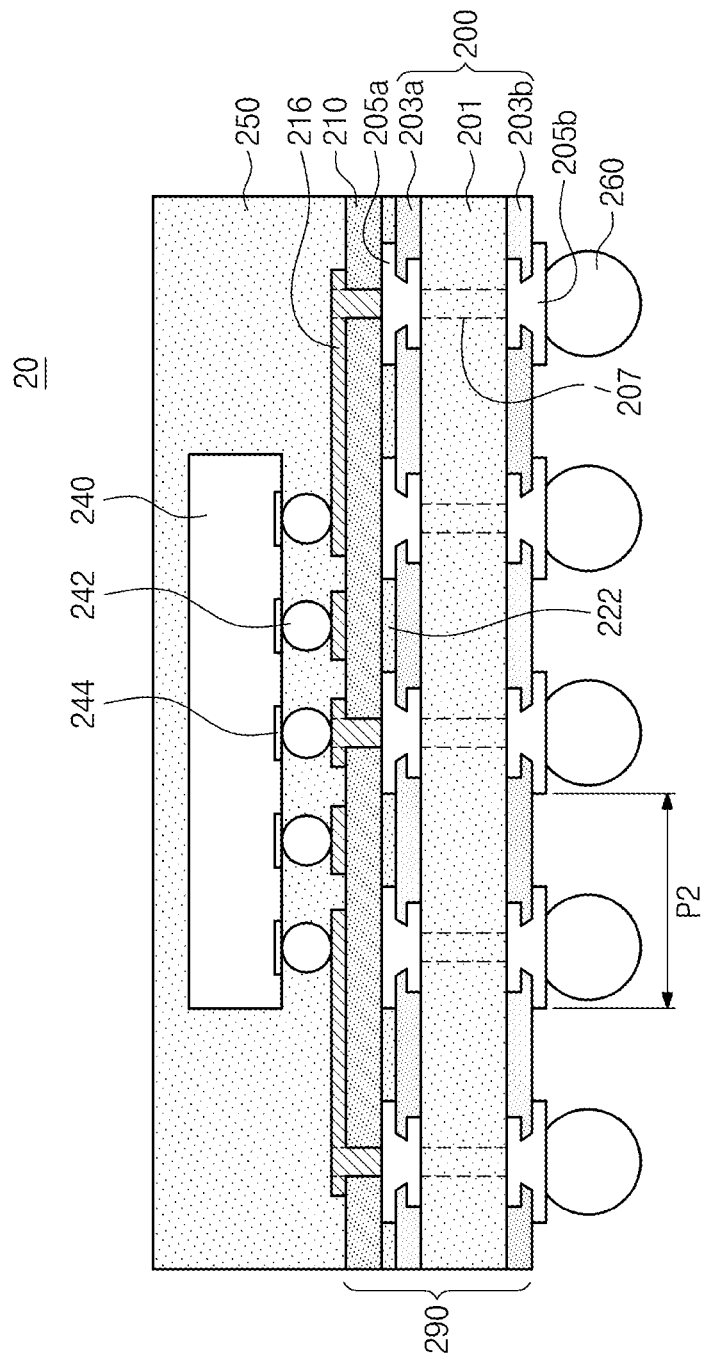
Figure 11B:
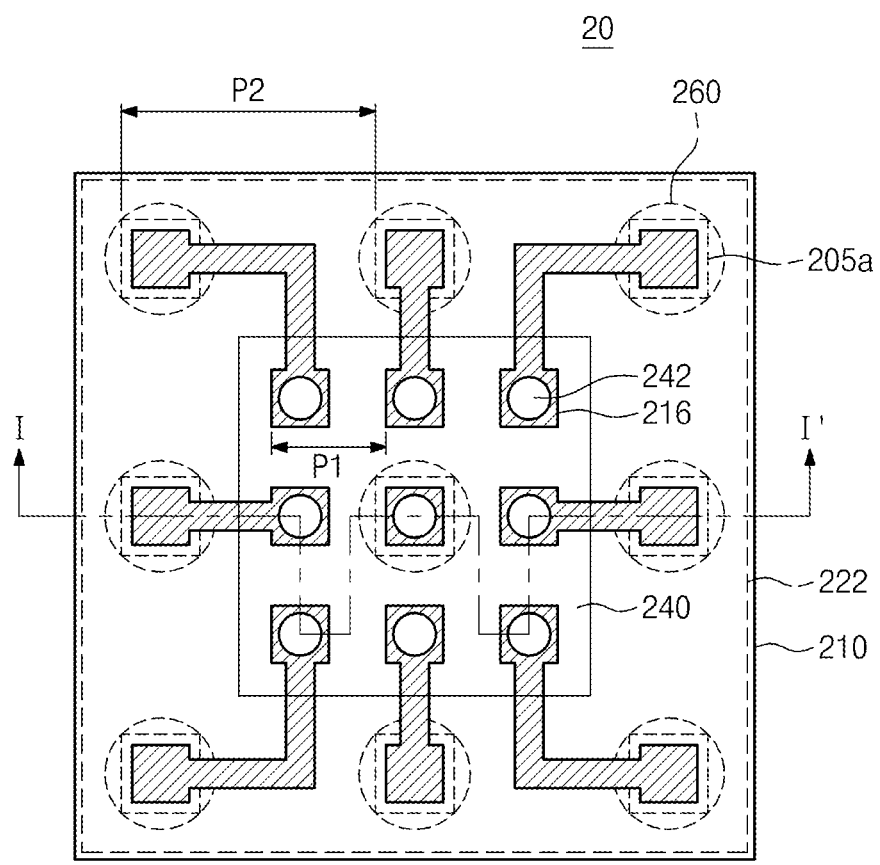

Referring to FIGS. 11A and 11B, a semiconductor package 20 may be formed by mounting a semiconductor chip 240 on the hybrid substrate 290. As an example, the semiconductor chip 240 may be a memory chip, a logic chip or combination thereof, which includes a chip pad 244 with a relatively fine pitch (for example the first pitch P1). The semiconductor chip 240 may be electrically connected to the hybrid substrate 290 in a flip-chip bonding scheme where the semiconductor chip 240 is mounted on the film 210 facedown and is connected to the connection pattern 216 through a solder ball 242. Optionally, a molding layer 250 may be further formed on the hybrid substrate 290 to mold the semiconductor chip 240. A solder ball 260 as an external terminal may be attached to the lower metal pattern 205b that is formed on the bottom surface of the hybrid substrate 290. The solder ball 260 may have the second pitch P2 like the upper metal pattern 205a and/or the lower metal pattern 205b.

The hybrid substrate 290 may include the connection pattern 216 having the fine first pitch P1, and thus the semiconductor chip 240 having the chip pad 244 with the first pitch P1 may be easily mounted on the hybrid substrate 290 with no assistance of an interposer. Moreover, the hybrid substrate 290 may electrically connect different electric devices with ease, for example the semiconductor chip 240 with the fine pitch P1 and a module substrate or semiconductor package with the coarse pitch P2.

According to example embodiments, the hybrid substrate 290 may include the printed circuit board 200 that is mainly formed of an organic material, and the film 210 that is formed of an organic material. Accordingly, defects due to mismatched coefficients of thermal expansion (CTE) may be prevented or minimized, compared to a case where an interposer formed of an inorganic material is attached to the printed circuit board formed of an organic material. Also, warpage of the semiconductor package 20 or the hybrid substrate 290 may be caused by heat that is delivered from the outer produced according to operations of the semiconductor chip 240 when the semiconductor package 20 is used normally. When the warpage is caused, defects, for example, delamination where the film 210 is separated from the printed circuit board 200, or a crack is generated in the film 210, may be prevented or reduced because the film 210 is formed of an organic material, for example a polyimide generally having lower modulus (for example, 2 GPa or lower) to be bendable more easily than an interposer formed of an inorganic material having greater modulus. The hybrid substrate 290, as described above, may have enhanced thermal and mechanical durability. The hybrid substrate 290 may be formed in various methods as described below, unlike the above-described.

<First Modification Example of Hybrid Substrate Forming Method>

Figure 12A:
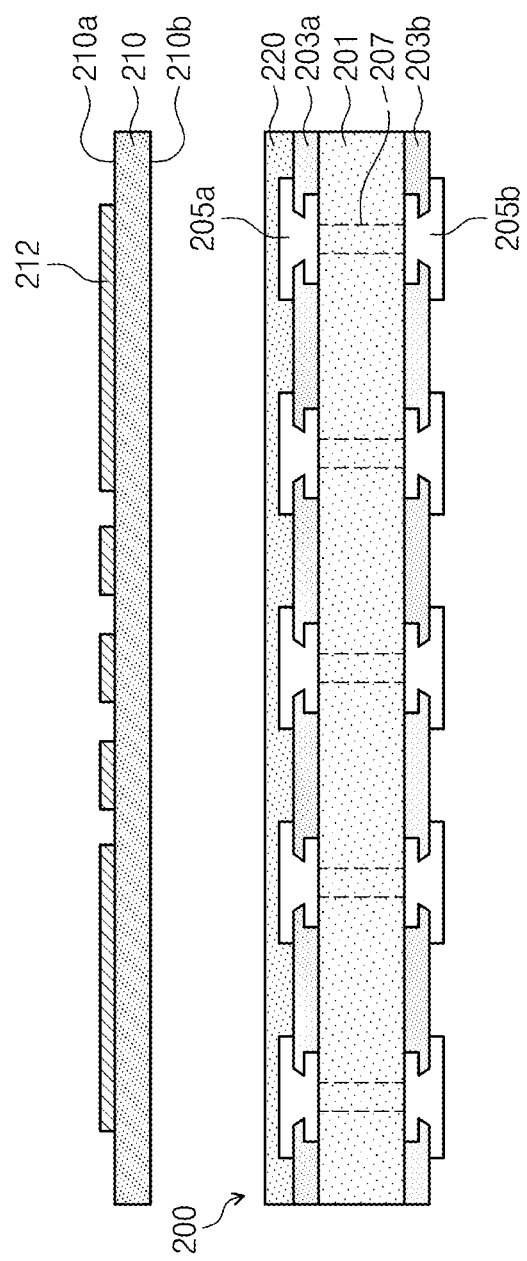
FIGS. 12A, 13A and 14A illustrate another example of hybrid substrate formation in a method for fabricating a semiconductor package according to example embodiments, and are sectional views taken along lines II-II' of FIGS. 12B, 13B and 14B, respectively.
Figure 12B:
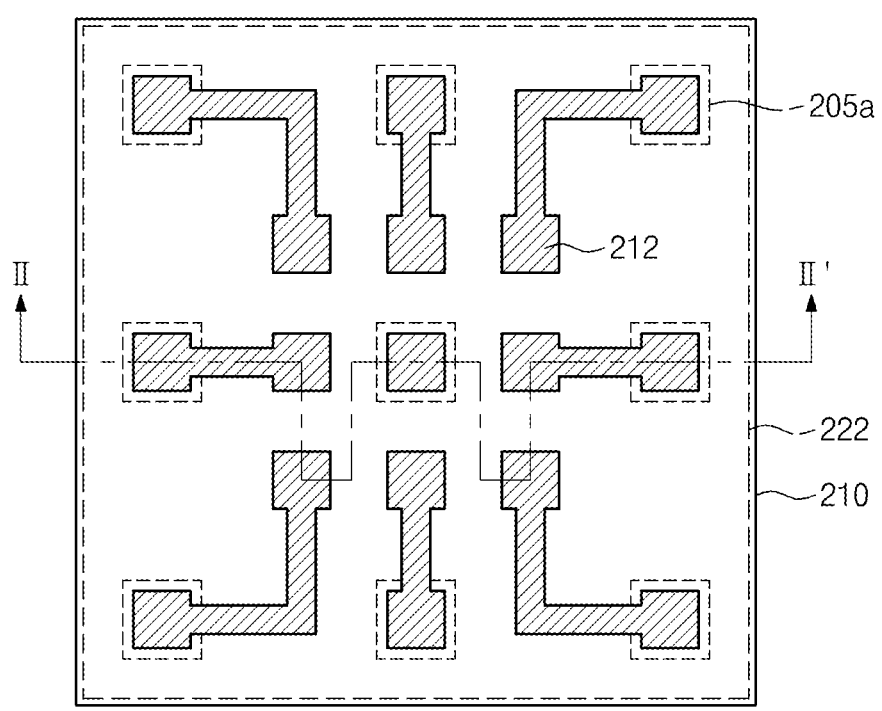
FIGS. 12B, 13B and 14B are plan views of FIGS. 12A, 13A and 14A, respectively.
Figure 13A:
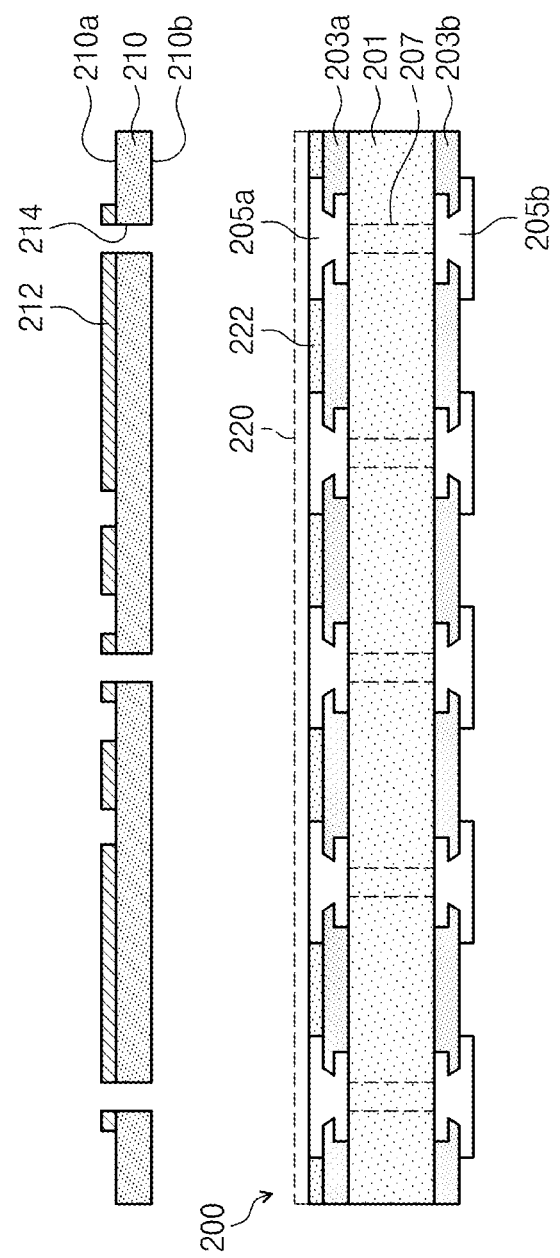
Figure 13B:
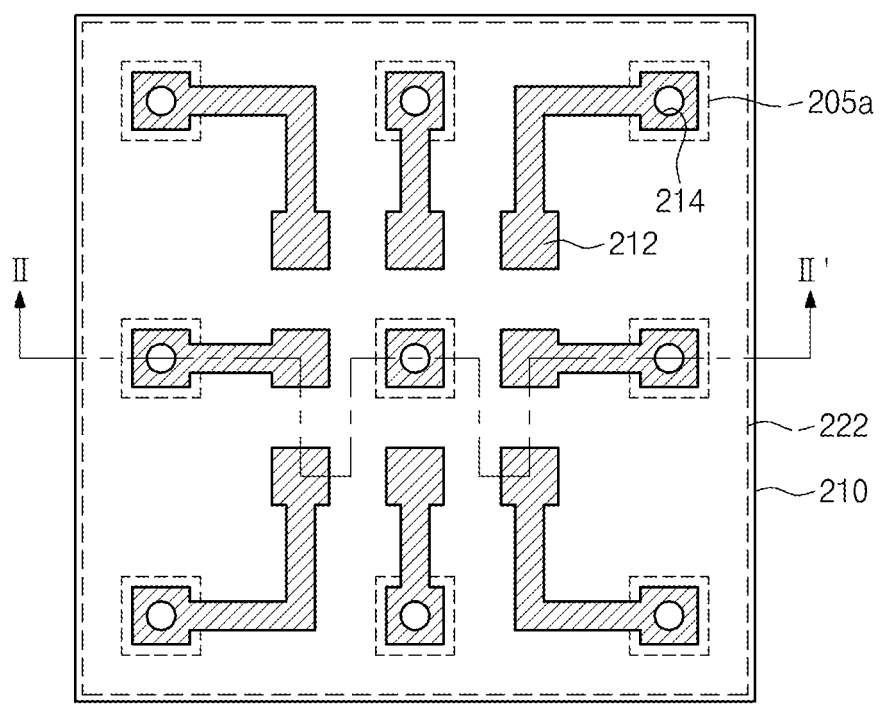
Figure 14A:
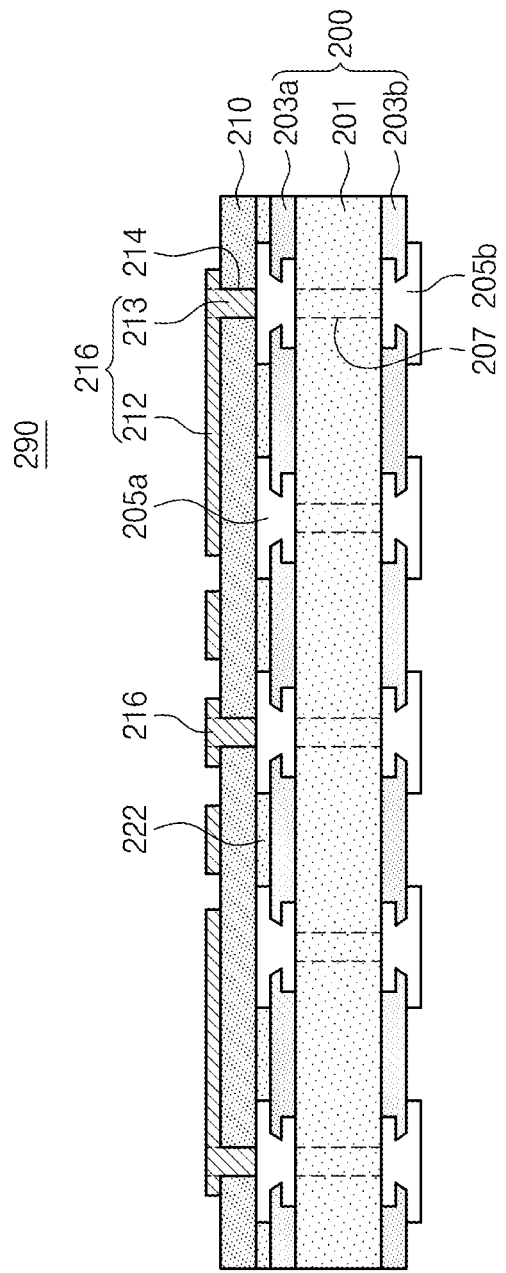
Figure 14B:
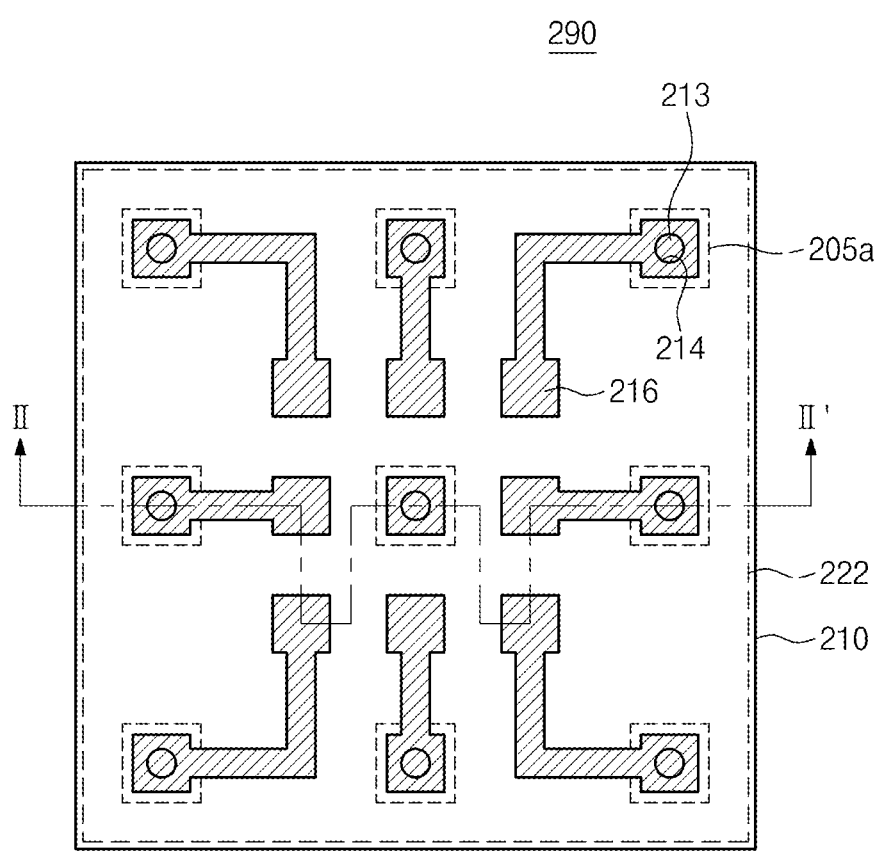

FIGS. 12A, 13A and 14A are sectional views illustrating another example of hybrid substrate formation, in a method for fabricating a semiconductor package according to example embodiments, FIGS. 12B, 13B and 14B are plan views of FIGS. 12A, 13A and 14A, respectively. FIGS. 12A, 13A and 14A are sectional views taken along lines II-II' of FIGS. 12B, 13B and 14B, respectively.

Referring to FIGS. 12A and 12B, the film 210 with the top surface 210a on which the metal layer 212 is formed, and the printed circuit board 200 on which the upper metal pattern 205a and the lower metal pattern 205b are formed may be provided. An adhesive material layer 220 that is formed of a resin-based material may be provided on the top surface of the printed circuit board 200. The adhesive material layer 220 may be coated to cover the upper metal pattern 205a of the printed circuit board 200.

Referring to FIGS. 13A and 13B, the via hole 214 may be formed through the metal layer 212 and the film 210 in a mechanical or laser drilling process. The via hole 214 may be aligned with the upper metal pattern 205a. The adhesive layer 222 having a pattern for exposing the upper metal pattern 205a may be formed by partially removing the adhesive material layer 220.

Referring to FIGS. 14A and 14B, the hybrid substrate 290 may be formed by attaching the film 210 to the printed circuit board 200. As an example, the via 213 filling the via hole 214 may be formed in a plating process similarly or identically to the process that has been described above with reference to FIG. 10A, and the metal layer 212 may be formed Lo configure the connection pattern 216 that is connected to the upper metal layer 205a through the via 213.

<Second Modification Example of Hybrid Substrate Formation Method>

Figure 15A:
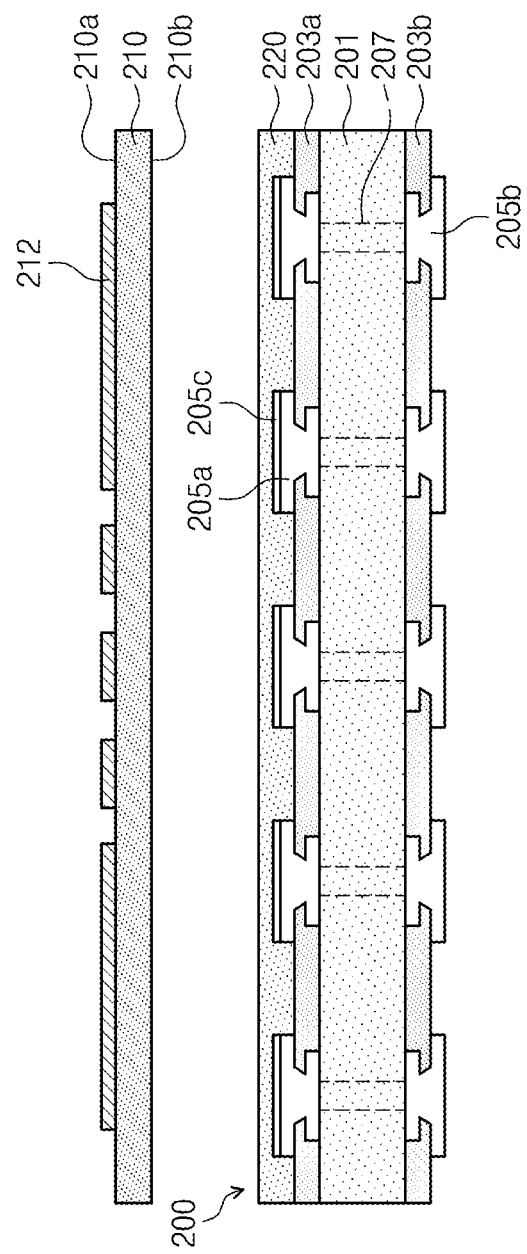
FIGS. 15A, 16A and 17A illustrate another example of hybrid substrate formation in a method for fabricating a semiconductor package according to example embodiments, and are sectional views taken along lines III-III' of FIGS. 15b, 16b, and 17b, respectively.
Figure 15B:
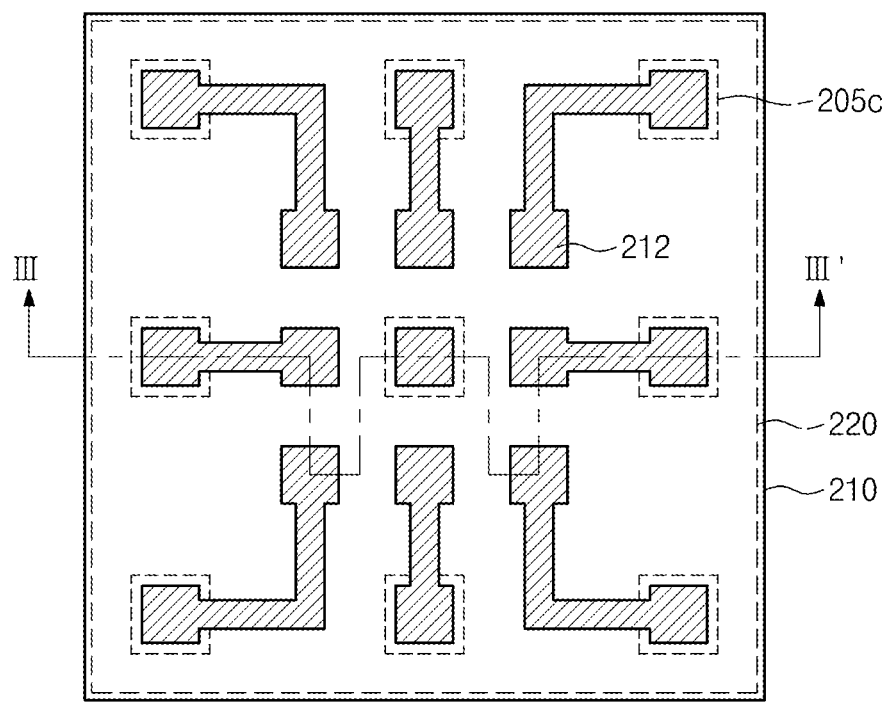
FIGS. 15B, 16B and 17B are plan views of FIGS. 15A, 16A and 17A, respectively.
Figure 16A:
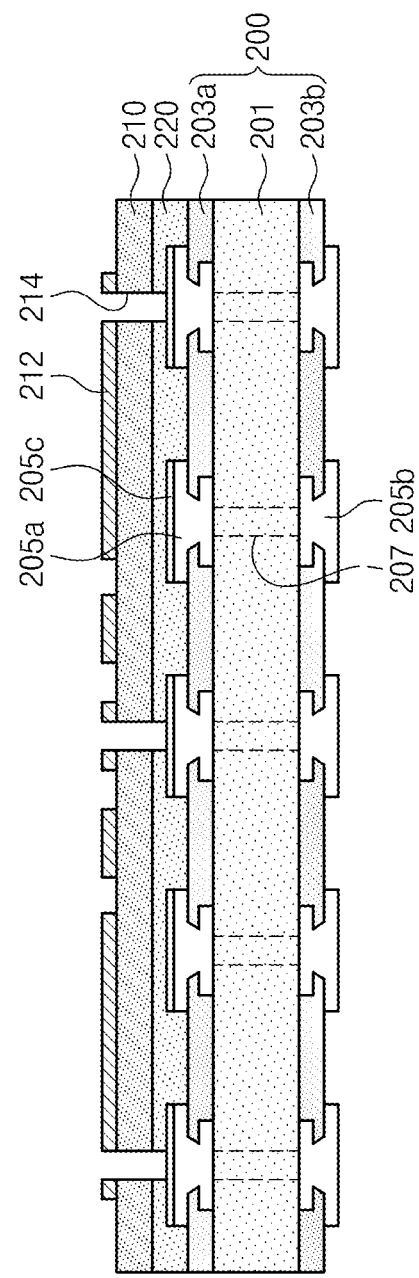
Figure 16B:
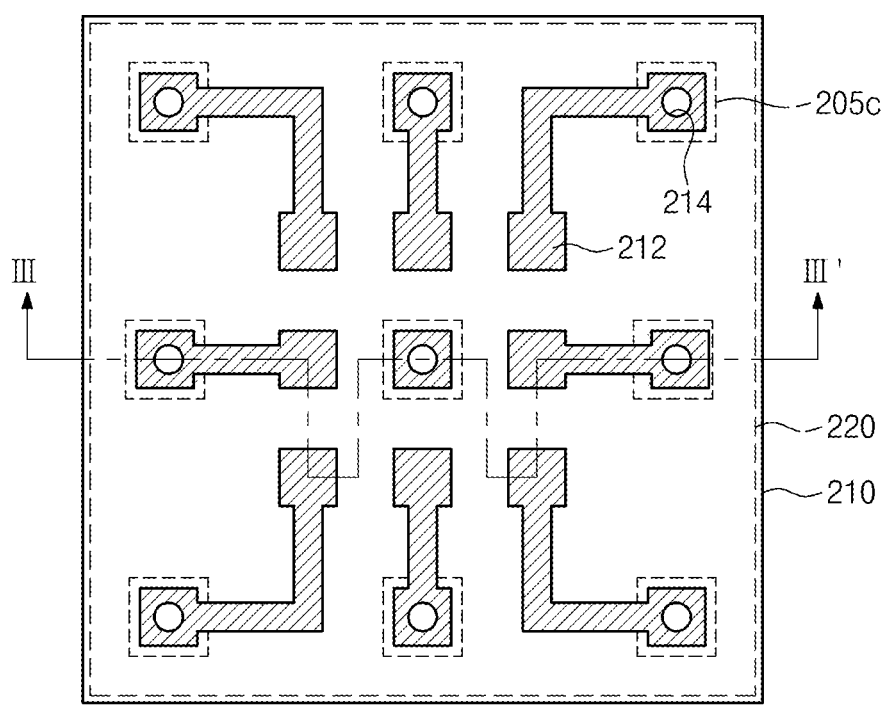
Figure 17A:
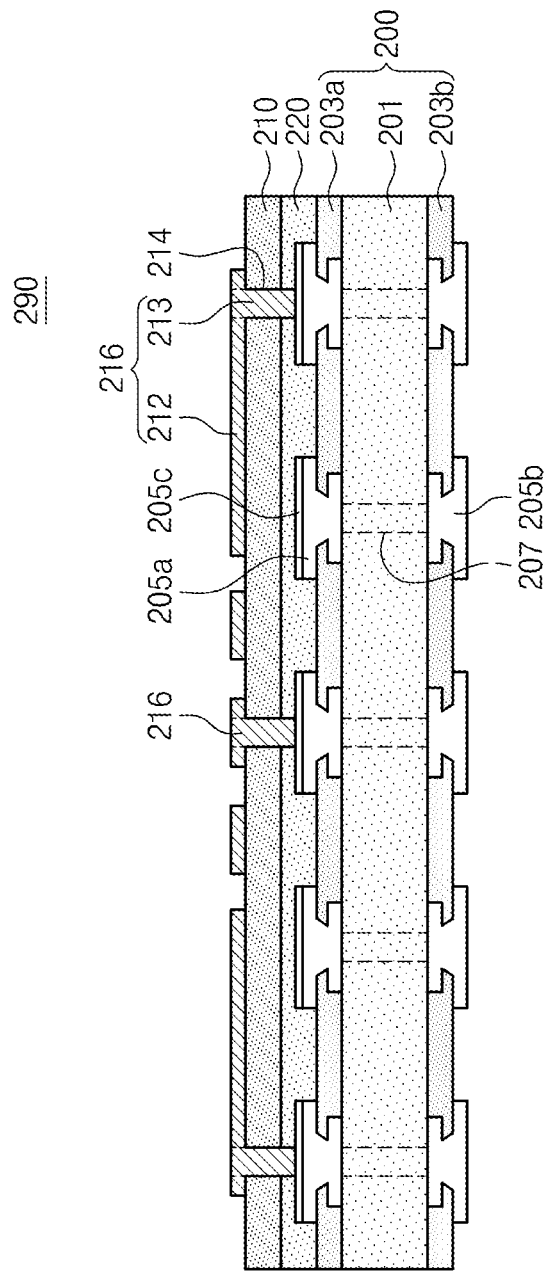
Figure 17B:
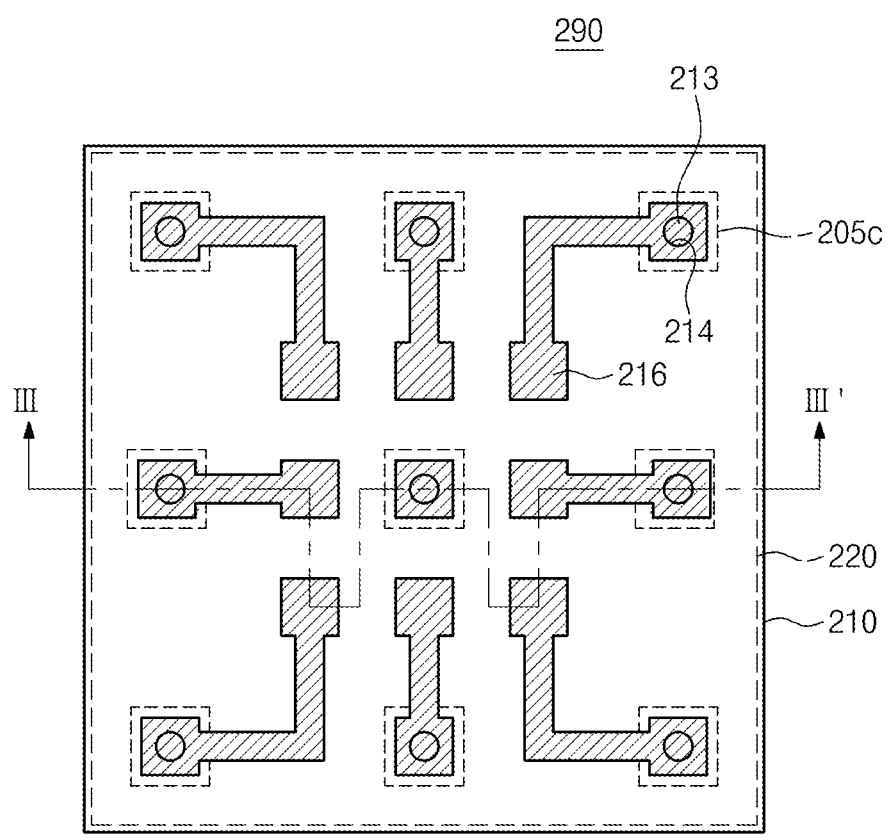

FIGS. 15A, 16A and 17A are sectional views illustrating another example of hybrid substrate formation, in a method for fabricating a semiconductor package according to example embodiments. FIGS. 15B, 16B and 17B are plan views of FIGS. 15A, 16A and 17A, respectively. FIGS. 15A, 16A and 17A are sectional views taken along lines III-III' of FIGS. 15B, 16B and 17B, respectively.

Referring to FIGS. 15A and 15B, the film 210 with the top surface 210a on which the metal layer 212 is formed, and the printed circuit board 200 on which the upper metal pattern 205a and the lower metal pattern 205b are formed may be provided. The adhesive material layer 220 that is formed of a resin-based material covering the upper metal pattern 205a on the top surface of the printed circuit board 200 may be provided. Optionally, a passivation layer 205c covering the upper metal pattern 205a may be further formed. The passivation layer 205c may protect the upper metal pattern 205a from laser damage in a subsequent process of forming a via hole 214 (see FIG. 16A). The passivation layer 205c may be formed of metal similar or identical to that of the upper metal pattern 205a, for example copper, aluminum, or nickel in a plating process.

Referring FIGS. 16A and 16B, the film 210 may be attached to the adhesive material layer 220, and the via hole 214 may be formed through the metal layer 212, the film 210, and the adhesive material layer 220. The via hole 214 may be formed in a laser drilling process. The passivation layer 205c may protect the upper metal pattern 205a from laser damage.

Referring to FIGS. 17A and 17B, the via 213 electrically connecting the metal layer 212 to the upper metal pattern 205a may be formed by filling the via hole 214 with metal. The via 213 may be formed in a plating process as illustrated in FIG. 10A. According to the above process, the hybrid substrate 290 may be formed as a printed circuit board 200 to which the film 210 is attached.

<Third Modification Example of Hybrid Substrate Forming Method>

Figure 18A:
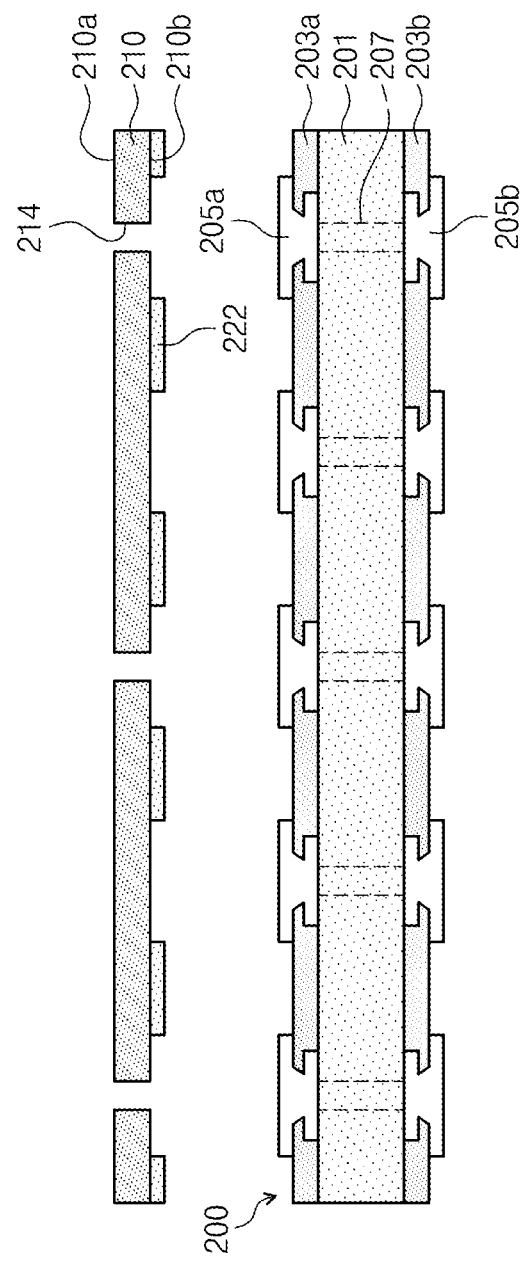
FIGS. 18A and 19A illustrate another example of hybrid substrate formation in a method for fabricating a semiconductor package according to example embodiments, and are sectional views taken along lines IV-IV' of FIGS. 18B and 19B, respectively.
Figure 18B:
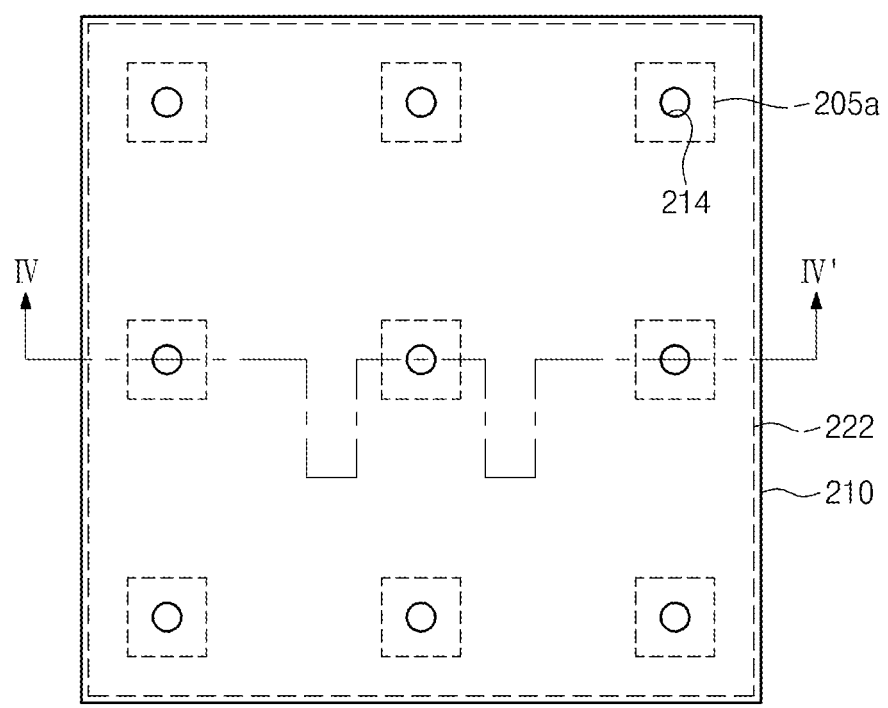
FIGS. 18B and 19B are plan views of FIGS. 18A and 19A, respectively.
Figure 19A:
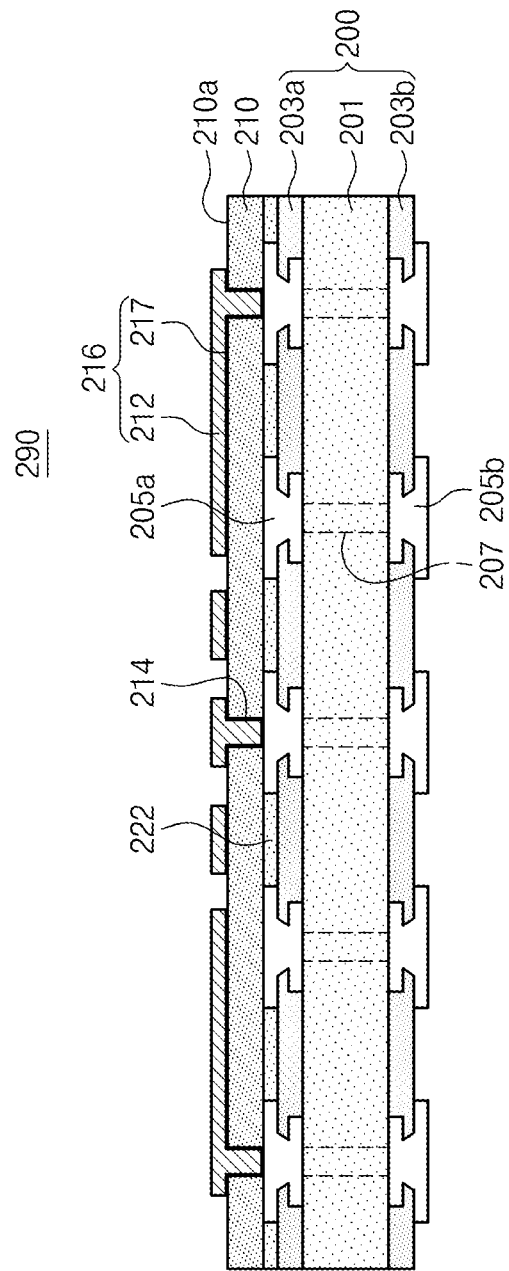
Figure 19B:
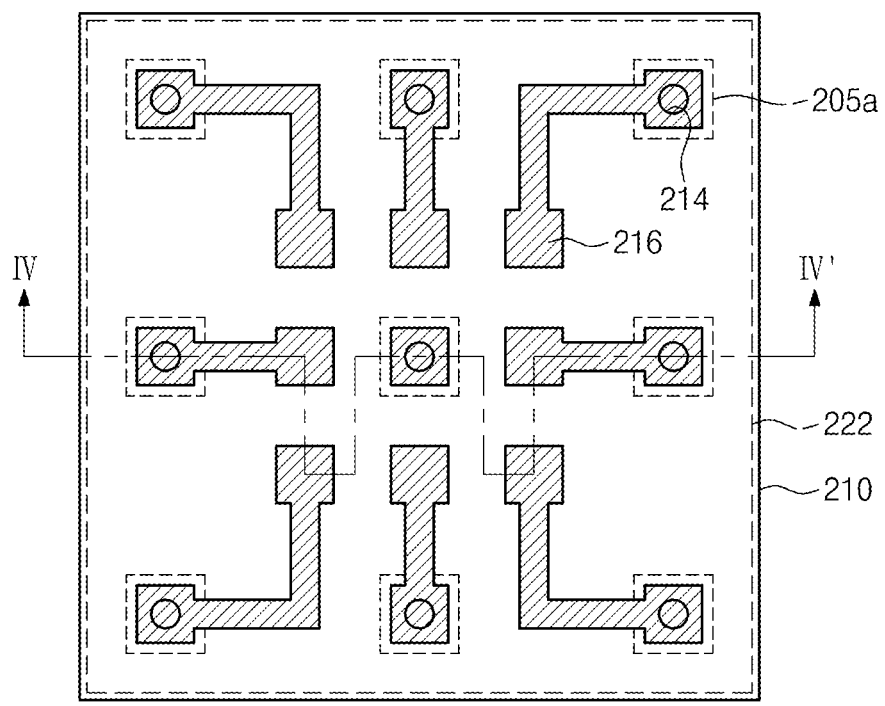

FIGS. 18A and 19A are sectional views illustrating another example of hybrid substrate formation, in a method for fabricating a semiconductor package according to example embodiments. FIGS. 18B and 19B are plan views of FIGS. 18A and 19A, respectively. FIGS. 18A and 19A are sectional views taken along lines IV-IV' of FIGS. 18B and 19B, respectively.

Referring to FIGS. 18A and 18B, the film 210 having a bottom surface 210b to which the adhesive layer 2 is attached and in which the via hole 214 is formed, and the printed circuit board 200 in which the upper metal pattern 205a and the lower metal pattern 205b are formed may be provided. The adhesive layer 222 may be patterned to accommodate the upper metal pattern 205a of the printed circuit board 200. Referring FIGS. 19A and 19B, the hybrid substrate 290, including the film 210 that is attached to the printed circuit board 200 and a connection pattern 216 that is connected to the upper metal pattern 205a, may be formed. For example, a seed layer 217 may be formed on an inner surface of the via hole 214 and on the top surface 210a of the film 210 and then a metal layer 212 may be formed on the seed layer 217, which may form the connection pattern 216. Since the film 210 may be formed of an organic material, for example, an insulating material such as a polyimide, the seed layer 217 may be formed in an electroless plating process. The metal layer 212 may be formed by growing metal from the seed layer 217 in an electroless or electro plating process. As another example, the connection pattern 216 may be formed in a screen printing process.

<Fourth Embodiment>

Figure 21:
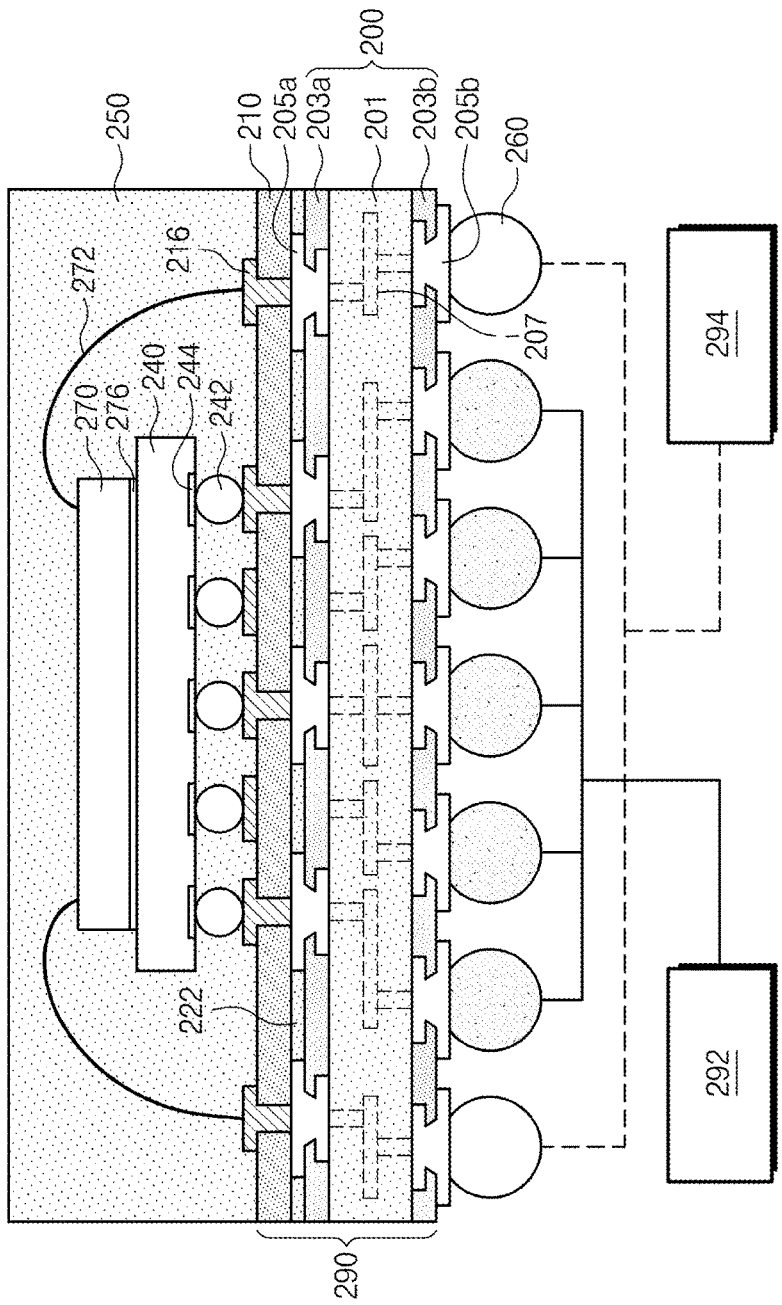

FIGS. 20 and 21 are sectional views illustrating a method for fabricating a semiconductor package according to example embodiments.

Referring to FIG. 20, the semiconductor chip 240 may be mounted on the hybrid substrate 290, and a second semiconductor chip 270 may be stacked over the semiconductor chip 240 with the adhesive layer 276 therebetween. The hybrid substrate 290 may be fabricated according to example embodiments. The semiconductor chip 240 may be flip-chip bonded on the hybrid substrate 290, and the second semiconductor chip 270 may be wire bonded on the hybrid substrate 290. For example, the solder ball 242 connected to the chip pad 244 of the semiconductor chip 240 may be connected to the connection pattern 216, and the semiconductor chip 240 may be electrically connected to the hybrid substrate 290. A bonding wire 272 may be connected to the connection pattern 216, and thus the second semiconductor chip 270 may be electrically connected to the hybrid substrate 290. The semiconductor chip 240 and the second semiconductor chip 270 may be the same or different kinds of semiconductor chips. For example, one of the semiconductor chips 240 and 270 may be a semiconductor chip for communication, and the other may be a semiconductor chip for a memory or display chip.

Referring to FIG. 21, the molding layer 250 that molds the semiconductor chips 240 and 270 may be formed on the hybrid substrate 290, and the semiconductor package 22 may be formed by attaching the solder ball 260 to the lower metal pattern 205b of the hybrid substrate 290. A semiconductor package 22 may be electrically connected to at least one of a first electric device 292 and a second electric device 294. For example, the semiconductor chips 240 and 270 may be electrically connected to one of the first and second electric devices 292 and 294. As another example, one of the semiconductor chips 240 and 270 may be electrically connected to the first electric device 292, and the other may be electrically connected to the second electric device 294.

As the other example, the semiconductor chip 240 may be connected to the first electric device 292 through the solder ball 260 (where the connection is illustrated as a solid line), and the second semiconductor chip 270 may be connected to the second electric device 294 through the solder ball 260 (where the connection is illustrated as a dot line). The first and second electric devices 292 and 294 may have different functions. For example, the first electric device 292 may have a display function, and the second electric device 294 may have a communication function. In this way, the semiconductor package 22 in which different kinds of semiconductor chips 240 and 270 are packaged may have multi-functions.

<Fifth Embodiment>

Figure 22:
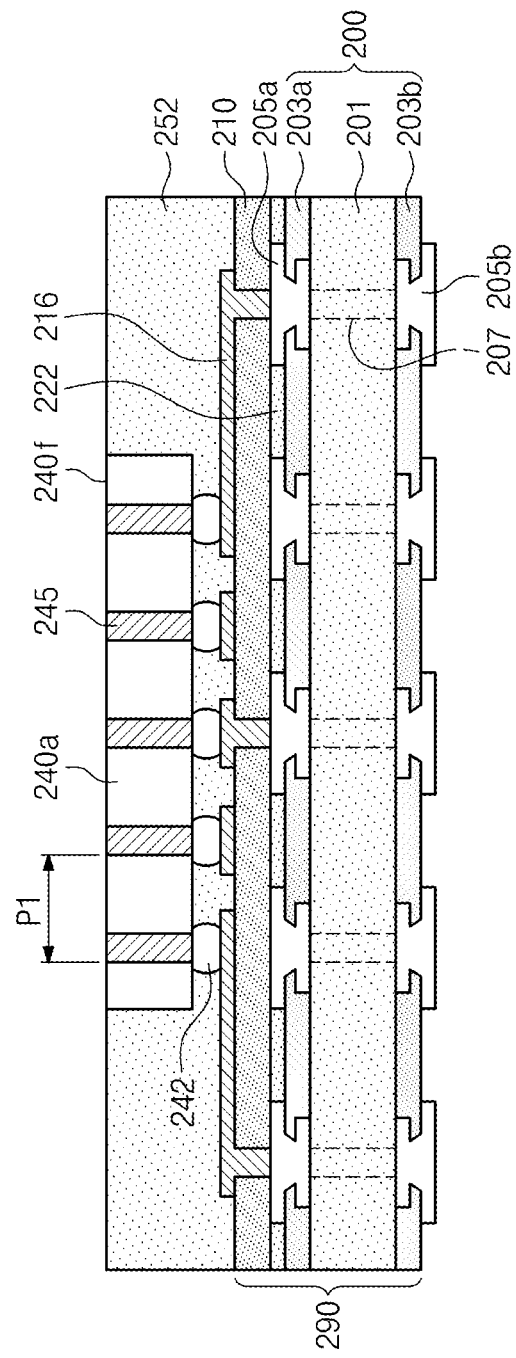
FIGS. 22 and 23 are sectional views illustrating a method for fabricating a semiconductor package according to example embodiments.
Figure 23:
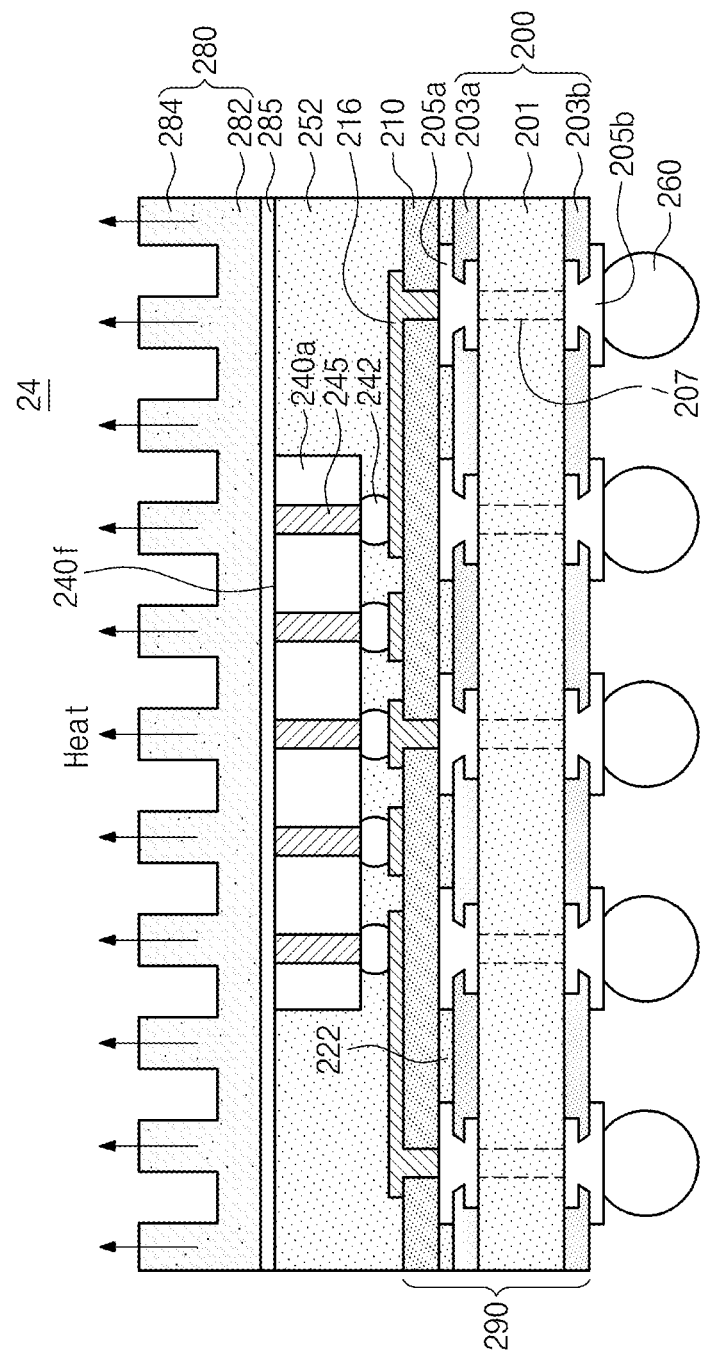

FIGS. 22 and 23 are sectional views illustrating a method for fabricating a semiconductor package according to example embodiments.

Referring to FIG. 22, a semiconductor chip 240a may be mounted on the hybrid substrate 290, and an exposed molding layer 252 exposing a top surface 240f of the semiconductor chip 240a may be formed. The semiconductor chip 240a may include at least one through electrode 245. The semiconductor chip 240a may be mounted in a face-down state where the active surface 240f is downward or a face-up state where the active surface 240f is upward as shown in FIG. 22. The through electrode 245 may have the first pitch P1 less than the second pitch P2. The solder ball 242 connected to the through electrode 245 may be connected to the connection pattern 216, and thus the semiconductor chip 240a may be electrically connected to the hybrid substrate 290.

Referring to FIG. 23, the semiconductor package 24 may be formed by attaching a heat spreader 280 to a top surface of the semiconductor chip 240a. The heat spreader 280 may include a plate 282 that is horizontally extended along the active surface 240f of the semiconductor chip 240a, and a plurality of heat radiation pins 284 perpendicularly protruding from the plate 282. The surface area of the heat spreader 280 is enlarged by the heat radiation pins 284, and thus heat that is usually generated from the active surface 240f can be emitted effectively. A heat transfer layer 285, for example, a thermal interface material (TIM), may be further formed between the semiconductor chip 240a and the heat spreader 280. The heat transfer layer 285 may be formed of an insulating material, for example, a resin or a ceramic.

<Application>

Figure 24A:
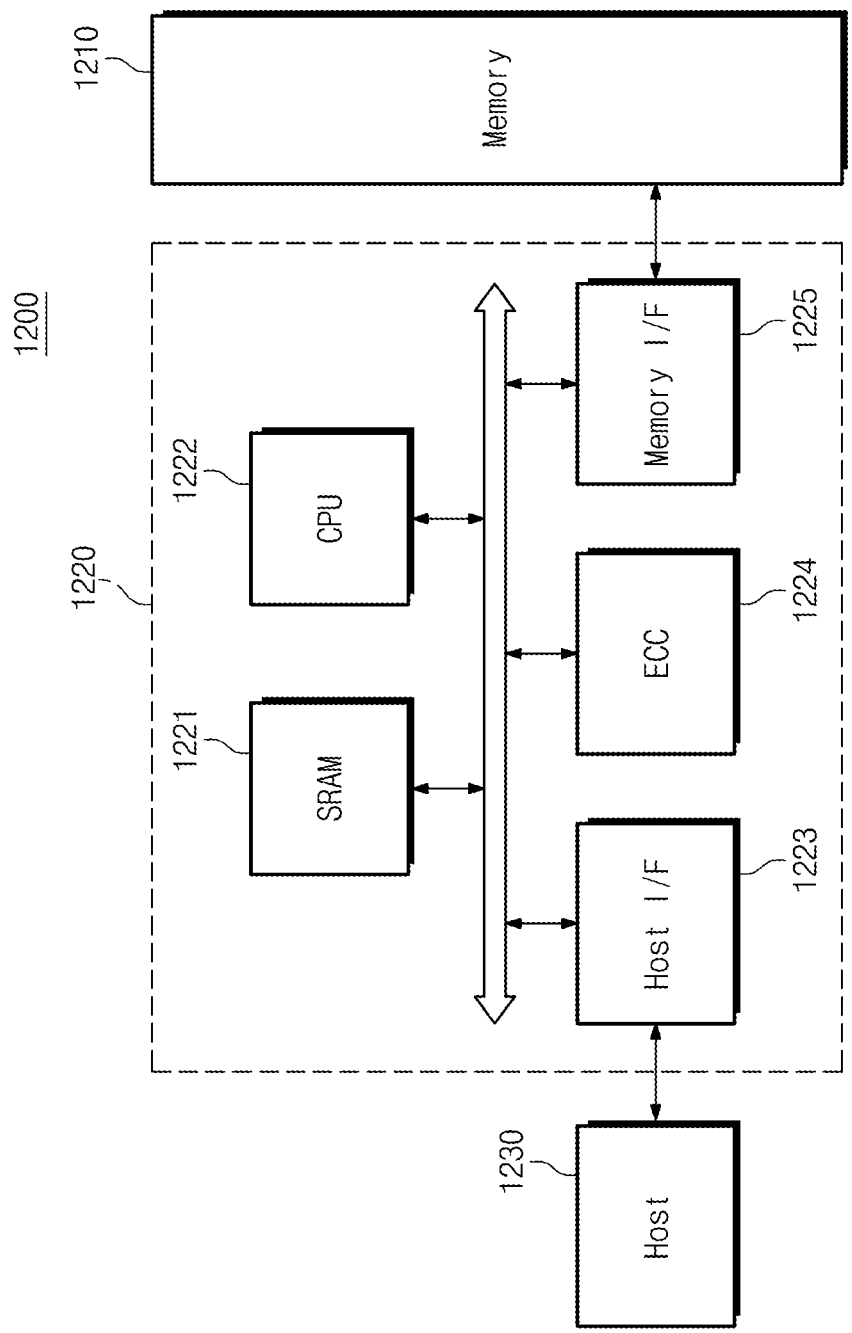
FIG. 24A is a block diagram illustrating a memory card including a semiconductor package according to example embodiments.
Figure 24B:
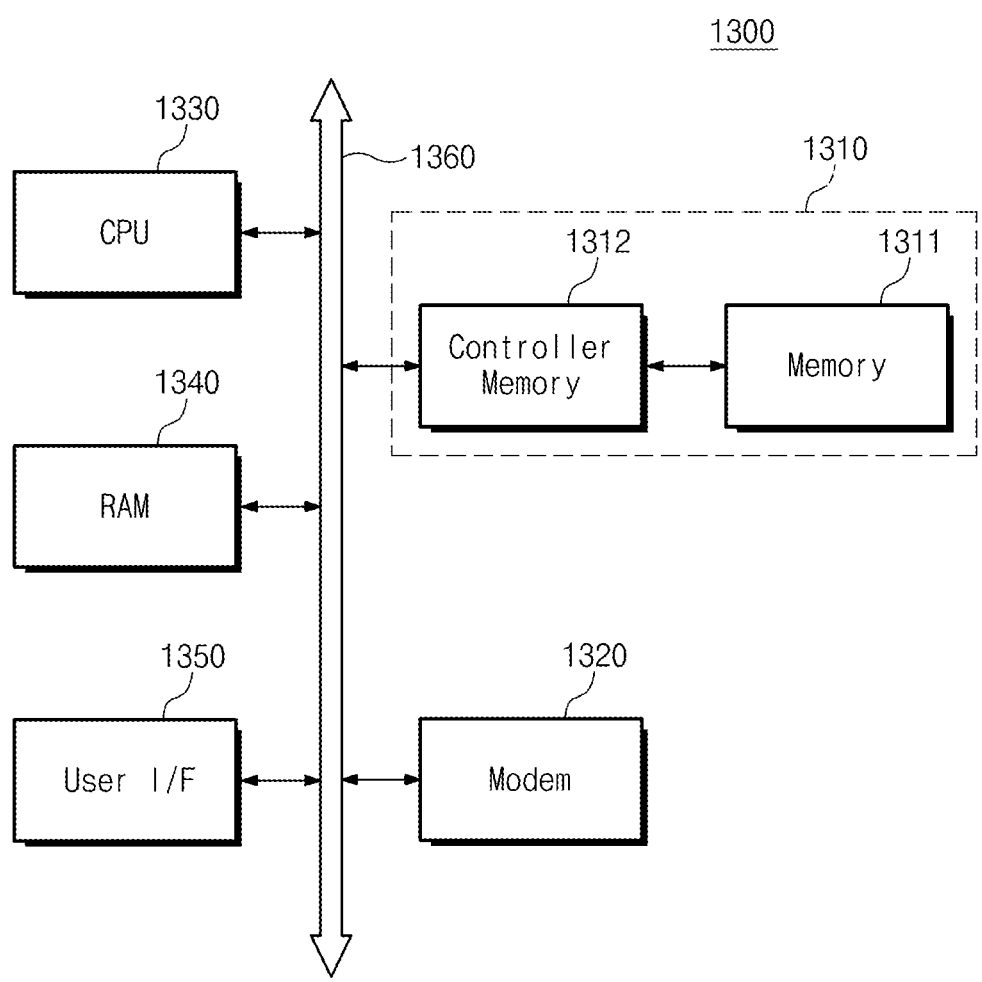
FIG. 24B is a block diagram illustrating an information processing system applying a semiconductor package according to example embodiments.

FIG. 24A is a block diagram illustrating a memory card including a semiconductor package according to example embodiments. FIG. 24B is a block diagram illustrating an information processing system applying a semiconductor package according to example embodiments.

Referring to FIG. 24A, a semiconductor memory 1210 including a semiconductor package according to example embodiments may be applied to a memory card 1200. As an example, the memory card 1200 includes a memory controller 1220 that controls data exchange between a host 1230 and the memory 1210. A static random access memory (SRAM) 1221 may be used as a working memory of a central processing unit 1222. A host interface 1223 may include a data exchange protocol of the host connected to the memory card 1200. An error correction code 1224 may detect and correct an error that is included in data read from the memory 1210. The memory interface 1225 interfaces with the memory 1210. The central processing unit 1222 performs an overall control operation for data exchange.

Referring to FIG. 24B, an information processing system 1300 may include a memory system 1310 including a semiconductor package according to example embodiments. The information processing system 1300 may include a mobile device or a computer. For example, the information processing system 1300 may include a modem 1320, a central processing unit (CPU) 1330, a RAM 1340 and a user interface 1350 that are electrically connected to the memory system 1310 through a system bus 1360. The memory system 1310 may include a memory 1311 and a memory controller 1312, and may be configured substantially identically to the memory card 1200 of FIG. 24A. The memory system 1310 may store data that is processed by the central processing unit 1330 or data inputted from the outside. The information processing system 1300 may be provided as a memory card, a solid state disk, a camera image processor, and an application chipset. For example, the memory system 1310 may be configured with a solid state disk (SSD). In this case, the information processing system 1300 may stably and reliably store large-scale data in the memory system 1310.

According to example embodiments, the hybrid substrate where a circuit layer or film having a relatively fine pitch is attached to the printed circuit board is provided, and thus a semiconductor chip with a relatively fine pitch may be easily mounted. Accordingly, an interposer which is for mounting a semiconductor chip having a relatively fine pitch on the printed circuit board may not be required, and thus the cost may not increase and a process may not added. Moreover, a flexible film may be attached to the printed circuit board, and thus the thermal and mechanical durability of the semiconductor package may be enhanced.

The above-disclosed subject matter is to be considered illustrative and not restrictive, and the appended claims are intended to cover all such modifications, enhancements, and example embodiments, which fall within the true spirit and scope of the inventive concepts. Thus, to the maximum extent allowed by law, the scope of the inventive concepts are to be determined by the broadest permissible interpretation of the following claims and their equivalents, and shall not be restricted or limited by the foregoing detailed description.

What is claimed is:

1. A semiconductor package including a plurality of external terminals, the semiconductor package comprising:
   a semiconductor chip including a plurality of chip pads, the chip pads having a first pitch;
   a first layer on the semiconductor chip, the first layer formed of a first organic material, the first layer including,
     a plurality of first conductive patterns on a bottom surface of the first layer, the first conductive patterns having a second pitch, the first conductive patterns connected to the chip pads,
     a plurality of second conductive patterns on a top surface of the first layer, the second conductive patterns having a third pitch, the third pitch being greater than the first pitch, and
     a plurality of circuit patterns connecting the first conductive patterns with the second conductive patterns;

a second layer on the first layer, the second layer formed of a second organic material different from the first organic material, the second layer including,
a plurality of first vias penetrating the second layer, and
a plurality of third conductive patterns on a top surface of the second layer, the first was connecting the second conductive patterns with the third conductive patterns; and
a third layer on the second layer, the third layer formed of the second organic material, the third layer including,
a plurality of second vias penetrating the third layer, the second vias connecting the third conductive patterns with the external terminals.

2. The semiconductor package of claim 1, wherein the first pitch is equal to or less than 10 μm and the third pitch is equal to or greater than 20 μm.

3. The semiconductor package of claim 1, wherein the first organic material is polyimide.

4. The semiconductor package of claim 1, wherein a thickness of the first layer is equal to or less than 20 μm.

5. The semiconductor package of claim 1, wherein
the second layer includes a core and insulation layers, the insulating layers covering the core on top and bottom surfaces of the core,
the core is formed of one of reinforced fiberglass or epoxy resin, and
the insulation layers is formed of prepreg.

6. The semiconductor package of claim 1, wherein
the circuit pattern includes a plurality of internal patterns, a plurality of first internal vias, and a plurality of second internal vias, the first internal vias having a fourth pitch, the internal patterns having a fifth pitch greater than the fourth pitch,
the internal patterns are connected to the first conductive patterns via the first internal vias, and further are connected to the second conductive patterns via the second internal vias.

7. The semiconductor package of claim 1, wherein the plurality of chip pads includes at least five chip pads.

8. The semiconductor package of claim 1, further comprising:
a plurality of first solder balls connecting the chip pads to first conductive patterns, and
a plurality of second solder balls functioning as the external terminals.

9. The semiconductor package of claim 8, wherein a pitch between the first solder balls is smaller than a pitch between the second solder balls.

10. A semiconductor package including a plurality of external terminals, the semiconductor package comprising:
a semiconductor chip including a plurality of chip pads, the chip pads having a first pitch;
a first layer on the semiconductor chip, the first layer including,
a plurality of first conductive patterns on a bottom surface of the first layer, the first conductive patterns having a second pitch, the first conductive patterns connected to the chip pads,
a plurality of second conductive patterns on a top surface of the first layer, the second conductive patterns having a third pitch greater than the first pitch, and
a plurality of circuit patterns connecting the first conductive patterns with the second conductive patterns;
a second layer on the first layer, the second layer including,
a plurality of first vias penetrating the second layer, and
a plurality of third conductive patterns on a top surface of the second layer, the third conductive patterns connected to the second conductive pattern via the first vias; and
a third layer on the second layer, the third layer including,
a plurality of second vias penetrating the third layer, the second vias connecting the third conductive patterns with the external terminals.

11. The semiconductor package of claim 10, wherein the first pitch is equal to or less than 10 μm and the third pitch is equal to or greater than 20 μm.

12. The semiconductor package of claim 10, wherein a thickness of the first layer is less than 10 μm.

13. The semiconductor package of claim 10, wherein the first layer is an inorganic layer, and the second and third layers are organic layers.

14. The semiconductor package of claim 13, wherein the inorganic layer includes one of a silicon-oxide ($SiO_2$), a silicon nitride (SiN), or any combination thereof.

15. The semiconductor package of claim 10, wherein
the circuit pattern includes a plurality of internal patterns, a plurality of first internal vias, and a plurality of second internal vias, the internal patterns having a fourth pitch, a pitch between the first internal vias being smaller than a pitch between the second internal vias,
the internal patterns are connected to the first conductive patterns via the first internal vias, and further are connected to the second conductive patterns via the second internal vias.

16. The semiconductor package of claim 10, wherein the chip pads include at least five chip pads.

17. The semiconductor package of claim 10, further comprising:
a plurality of first solder balls connecting the chip pads to the first conductive patterns, and
a plurality of second solder balls functioning as the external terminals.

18. The semiconductor package of claim 17, wherein a pitch between the first solder balls is smaller than a pitch between the second solder balls.

19. A semiconductor package including a plurality of external terminals, the semiconductor package comprising:
a semiconductor chip including a plurality of chip pads and at least one through electrode, the chip pads having a first pitch;
a first layer on the semiconductor chip, the first layer formed of a first organic material the first layer including,
a plurality of first conductive patterns on a bottom surface of the first layer, the first conductive patterns having a second pitch, the first conductive patterns connected to the chip pads,
a plurality of second conductive patterns on a top surface of the first layer, the second conductive patterns having a third pitch greater than the first pitch, and
a plurality of circuit patterns connecting the first conductive patterns with the second conductive patterns;
a second layer on the first layer, the second layer formed of a second organic material different from the first organic material, the second layer including,
a plurality of first vias penetrating the second layer, and
a plurality of third conductive patterns on a top surface of the second layer, the third conductive patterns connected to the second conductive patterns via the first vias; and a third layer on the second layer, the third layer formed of the second organic material, the third layer including,
a plurality of second was penetrating the third layer, the second vias connecting the third conductive patterns with the external terminals.

20. The semiconductor package of claim 19, wherein the at least one through electrode is connected with a corresponding one of the chip pads.

* * * * *